United States Patent
Lee et al.

(10) Patent No.: US 10,770,477 B2
(45) Date of Patent: Sep. 8, 2020

(54) VERTICAL SEMICONDUCTOR DEVICES

(71) Applicant: SAMSUNG ELECTRONICS CO., LTD., Suwon-si (KR)

(72) Inventors: Bong-Yong Lee, Suwon-si (KR); Tae-Hun Kim, Gwacheon-si (KR); Min-Kyung Bae, Hwaseong-si (KR); Myung-Hun Woo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/401,667

(22) Filed: May 2, 2019

(65) Prior Publication Data

US 2020/0144285 A1    May 7, 2020

(30) Foreign Application Priority Data

Nov. 7, 2018   (KR) .................. 10-2018-0135545

(51) Int. Cl.
*H01L 29/76* (2006.01)
*H01L 27/11582* (2017.01)
*H01L 27/1157* (2017.01)
*H01L 21/311* (2006.01)
*H01L 27/11565* (2017.01)

(52) U.S. Cl.
CPC .... *H01L 27/11582* (2013.01); *H01L 27/1157* (2013.01); *H01L 21/31111* (2013.01); *H01L 27/11565* (2013.01)

(58) Field of Classification Search
None
See application file for complete search history.

(56) References Cited

U.S. PATENT DOCUMENTS

| | | | |
|---|---|---|---|
| 9,472,569 B2 | 10/2016 | Lee et al. | |
| 9,508,730 B2 | 11/2016 | Lee et al. | |
| 9,716,099 B2 | 7/2017 | Choi | |
| 9,780,112 B2 | 10/2017 | Liu et al. | |
| 9,985,098 B2 | 5/2018 | Matsumoto et al. | |
| 10,020,363 B2 | 7/2018 | Ogawa et al. | |
| 2018/0138195 A1 | 5/2018 | Lee | |
| 2018/0350831 A1* | 12/2018 | Kim | G11C 7/14 |
| 2019/0043889 A1* | 2/2019 | Park | H01L 27/11582 |
| 2019/0326307 A1* | 10/2019 | Mushiga | H01L 27/11582 |

* cited by examiner

*Primary Examiner* — Hung K Vu
(74) *Attorney, Agent, or Firm* — Sughrue Mion, PLLC

(57) ABSTRACT

A vertical semiconductor device includes a plurality of channel connection patterns, a lower insulation layer, a supporting layer, a stacked structure, and a channel structure. The channel connection patterns, on which the lower insulation layer is formed, contact a substrate. The supporting layer is formed on the lower insulation layer to be spaced apart from the channel connection patterns, and includes polysilicon doped with impurities. The stacked structure is formed on the supporting layer, and includes insulation layers and gate electrodes to form a memory cell string. The channel structure passes through the stacked structure, the supporting layer and the lower insulation layer, and includes a charge storage structure and a channel which contacts the channel connection patterns. The charge storage structure and the channel face the gate electrodes and the supporting layer. The supporting layer serves as a gate of a gate induced drain leakage (GIDL) transistor.

20 Claims, 24 Drawing Sheets

VERTICAL SEMICONDUCTOR DEVICES

CROSS-REFERENCE TO THE RELATED APPLICATION

This application claims priority from Korean Patent Application No. 10-2018-0135545, filed on Nov. 7, 2018, in the Korean Intellectual Property Office, the contents of which are incorporated by reference herein in their entirety.

BACKGROUND

1. Field

Apparatuses consistent with example embodiments of the inventive concept relate to vertical semiconductor devices.

2. Description of the Related Art

In a VNAND flash memory device, a gate induced drain leakage (GIDL) transistor may be formed under a ground selection transistor. Stored data in memory cells may be erased using holes generated by a gate induced drain leakage of the GIDL transistor. In order to reduce an erase voltage, the GIDL transistor may need to have a high efficiency of hole generation by the GIDL. Also, a height of the GIDL transistor needs to decrease so that a height of the VNAND flash memory device may not greatly increase.

Information disclosed in this Background section has already been known to the inventors before achieving the inventive concept of the present application or is technical information acquired in the process of achieving the inventive concept. Therefore, it may contain information that does not form the prior art that is already known to the public.

SUMMARY

Various example embodiments are directed to a vertical semiconductor device having excellent electrical characteristics.

According to example embodiments, there is provided a vertical semiconductor device. The vertical semiconductor device may include a plurality of channel connection patterns, a lower insulation layer, a supporting layer, a stacked structure and a channel structure. The channel connection patterns may contact a substrate. The lower insulation layer may be formed on the channel connection patterns. The supporting layer may be formed on the lower insulation layer to be spaced apart from the channel connection patterns. The supporting layer may include polysilicon doped with impurities. The stacked structure may be formed on the supporting layer, the stacked structure may include insulation layers and gate electrodes to form a memory cell string. The channel structure may pass through the stacked structure, the supporting layer and the lower insulation layer. The channel structure may include a charge storage structure and a channel. The channel may contact the channel connection pattern. The charge storage structure and the channel may be disposed to face the gate electrodes and the supporting layer. The supporting layer may serve as a gate of a GIDL (gate Induced Drain Leakage) transistor.

According to example embodiments, there is provided a vertical semiconductor device. The vertical semiconductor device may include a plurality of channel connection patterns, a lower insulation layer, a supporting layer, a stacked structure and a channel structure. The channel connection patterns may contact an upper surface of a substrate. The lower insulation layer may be formed on the channel connection patterns and a portion between the channel connection patterns. The supporting layer may be formed on the lower insulation layer to be spaced apart from the channel connection patterns. The supporting layer may include polysilicon doped with impurities. The stacked structure may be formed on the supporting layer. The stacked structure may include insulation layers and gate electrodes repeatedly and alternately stacked. The channel structure may pass through the stacked structure, the supporting layer and the lower insulation layer. The channel structure may extend to an upper portion of the substrate. The channel structure may include a charge storage structure and a channel. The channel may contact the channel connection pattern and may have a cylindrical shape. The charge storage structure and the channel may be disposed to face the gate electrodes and the supporting layer. A width of the channel at a level below an upper surface of the supporting layer may be greater than a width of the channel at a level above the upper surface of the supporting layer.

According to example embodiments, there is provided a vertical semiconductor device. The vertical semiconductor device may include a lower gate layer, a stacked structure, and a channel structure. The lower gate layer may be spaced apart from a substrate, and the lower gate layer may include polysilicon doped with impurities. The stacked structure may be formed on the lower gate layer. The stacked structure may include insulation layers and gate electrodes repeatedly stacked to form a memory cell string, and the gate electrodes may include a metal. The channel structure may pass through the stacked structure, and the lower gate layer. The channel structure may extend to an upper portion of the substrate, the channel structure may include a charge storage structure and a channel including a cylindrical shape. The charge storage structure and the channel may be disposed to face the gate electrodes and the lower gate layer. A width of the channel at a level below an upper surface of the lower gate layer may be greater than a width of the channel at a level above the upper surface of the lower gate layer.

In example embodiments, the vertical semiconductor device may include the supporting layer to support structures formed on the supporting layer, and the supporting layer may serve as a gate of a GIDL transistor. Thus, a vertical height of the vertical semiconductor device may be reduced. Also, in the vertical semiconductor device, a width of a lower portion of the channel may decrease, so that electrical characteristics of the GIDL transistor may be improved.

BRIEF DESCRIPTION OF THE DRAWINGS

Example embodiments will be more clearly understood from the following detailed description taken in conjunction with the accompanying drawings.

FIGS. 1 to 3 are cross-sectional views and a plan view illustrating a vertical semiconductor device in accordance with example embodiments;

FIGS. 4 and 5 are cross-sectional views illustrating vertical semiconductor devices in accordance with example embodiments, respectively;

FIGS. 6 to 22 are plan views and cross-sectional views illustrating stages of a method of manufacturing a vertical semiconductor device in accordance with example embodiments;

FIGS. 23 and 24 are cross-sectional views illustrating a vertical semiconductor device in accordance with example embodiments;

FIG. 25 is a cross-sectional view illustrating stages of a method of manufacturing a vertical semiconductor device in accordance with example embodiments;

FIGS. 26 and 27 are cross-sectional views illustrating a vertical semiconductor device in accordance with example embodiments; and FIG. 28 is a cross-sectional view illustrating a vertical semiconductor device in accordance with example embodiments.

DESCRIPTION OF EXAMPLE EMBODIMENTS

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Hereinafter, a direction substantially parallel to an upper surface of the substrate is defined as a first direction, and a direction substantially perpendicular to the upper surface of the substrate are defined as a vertical direction.

Figure 1:
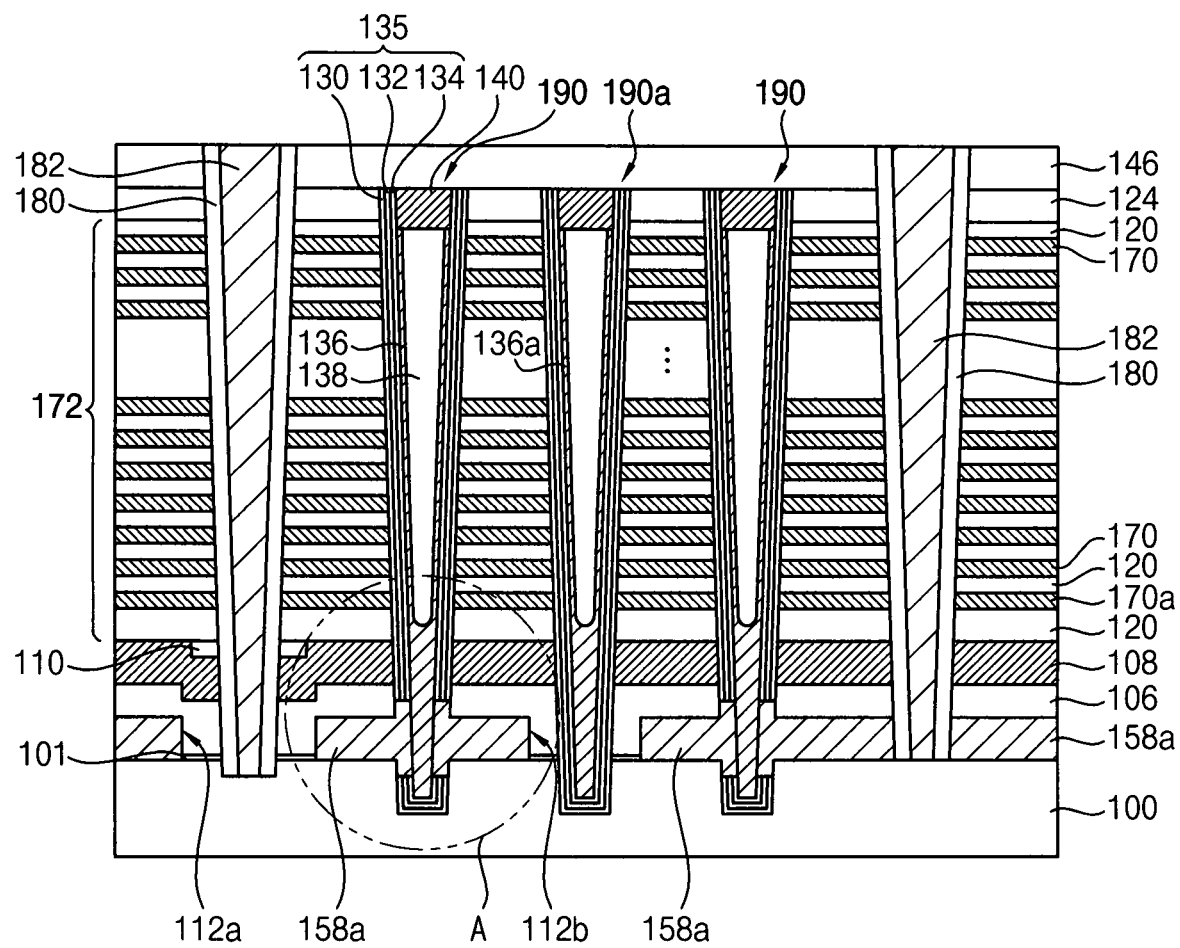
FIGS. 1 to 28 represent non-limiting, example embodiments as described herein.
Figure 2:
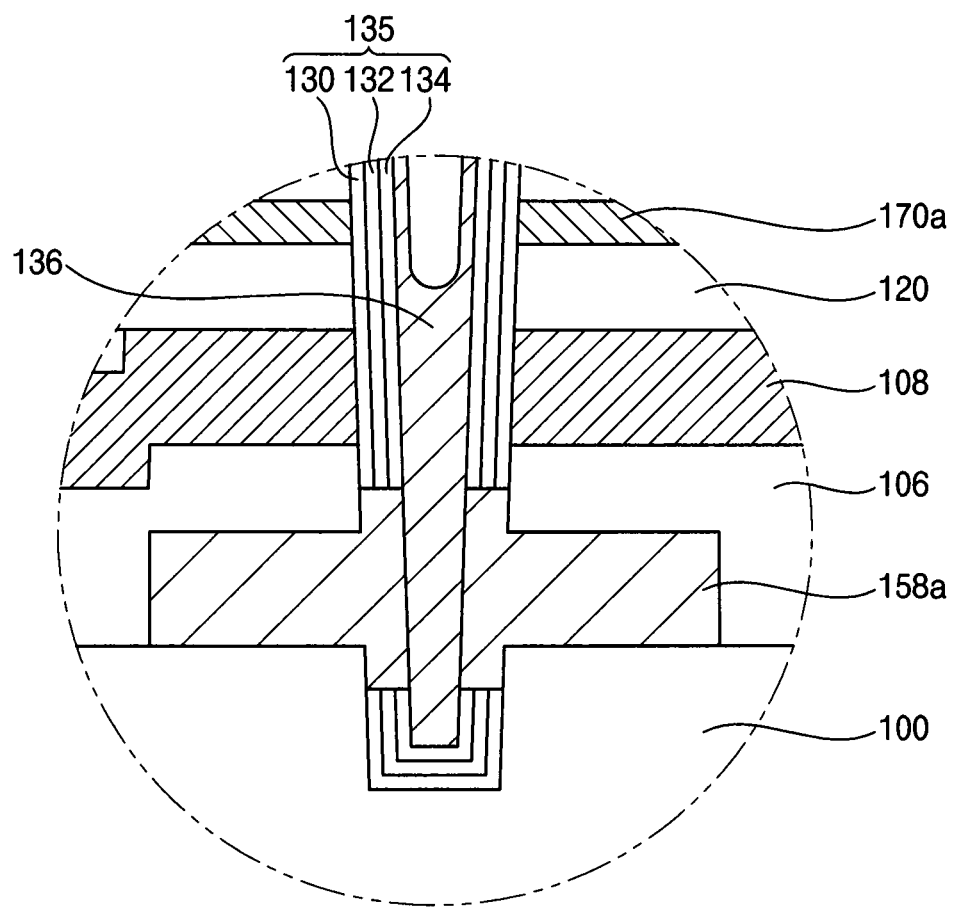
Figure 3:
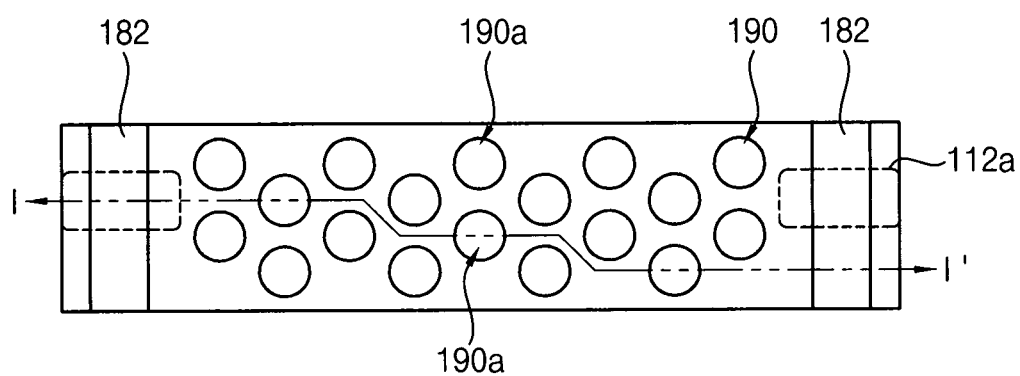
Figure 4:
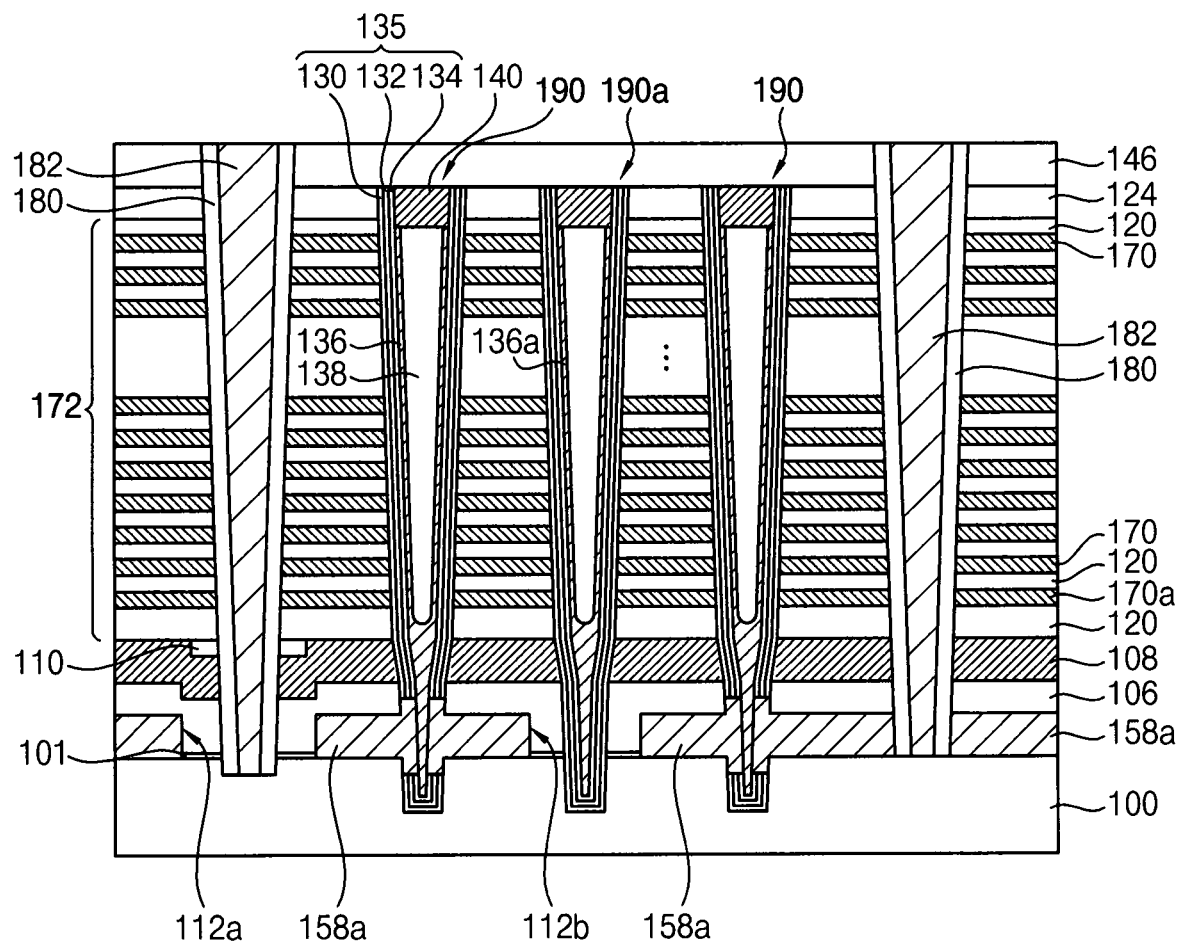
Figure 5:
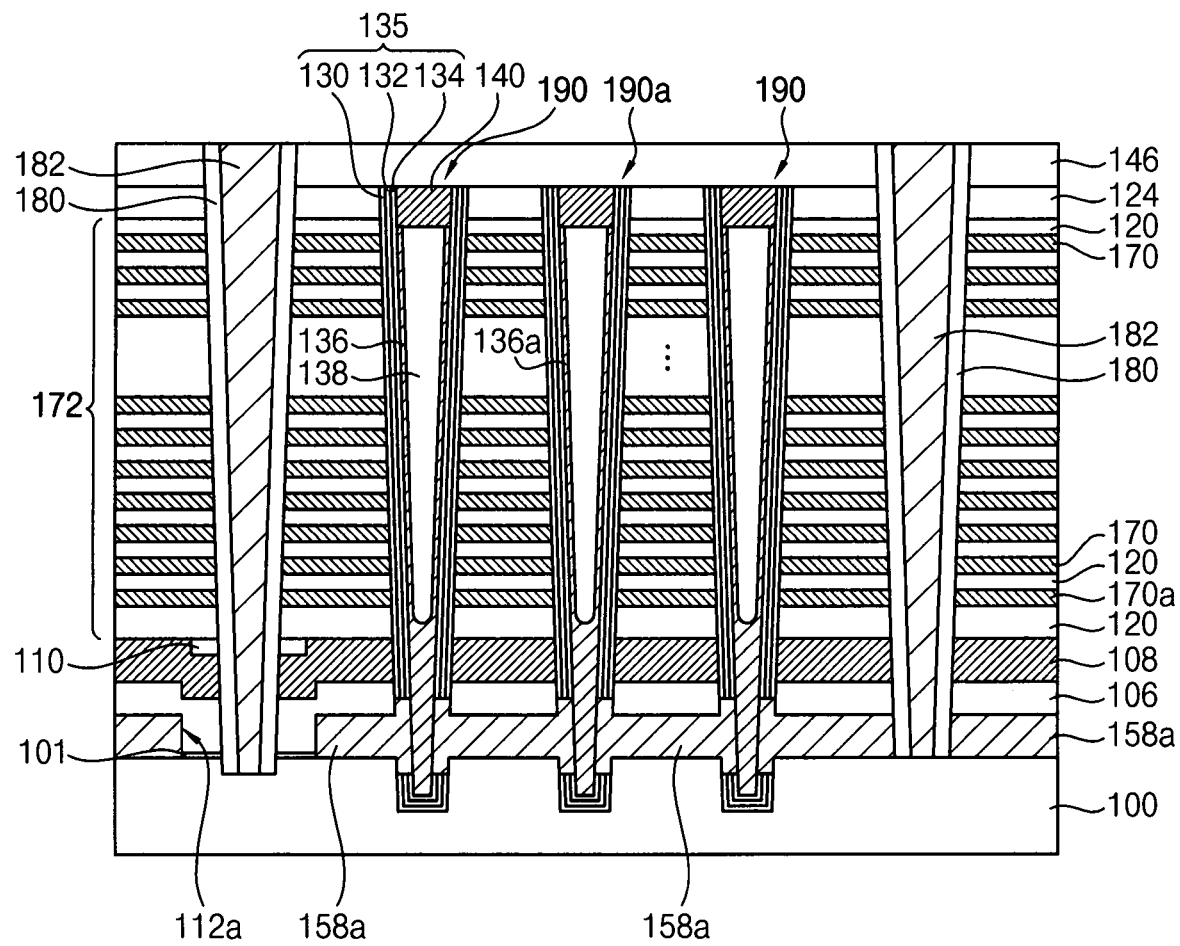

FIGS. 1 to 3 are cross-sectional views and a plan view illustrating a vertical semiconductor device in accordance with example embodiments. FIGS. 4 and 5 are cross-sectional views illustrating vertical semiconductor devices in accordance with example embodiments, respectively.

FIGS. 1 and 2 are cross-sectional views, and FIG. 3 is a plan view. FIG. 2 is an enlarged view of a portion "A" in FIG. 1.

FIG. 1 is a cross-sectional view taken along the line I-I' of FIG. 3. Particularly, in the FIG. 1, portions of a common source line, a channel structure, and a dummy channel structure are shown.

Referring to FIGS. 1, 2 and 3, the vertical semiconductor device may include channel connection patterns 158a, a lower insulation layer 106, a supporting layer 108, a stacked structure 172, and a channel structure 190 formed on a substrate 100. Further, the vertical semiconductor device may include a common source line 182, a spacer 180, and a dummy channel structure 190a.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

In example embodiments, a pad layer 101 may be formed on a portion of an upper surface of the substrate 100. The pad layer 101 may include an insulation material. For example, the pad layer 101 may include an oxide, e.g., silicon oxide.

The channel connection patterns 158a may be electrically connected with the channel 136 and the substrate 100 to each other. Thus, at least a portion of the channel connection patterns 158a may directly contact the substrate 100. In example embodiments, entire lower surfaces of the channel connection patterns 158a may contact the upper surface of the substrate 100. The channel connection patterns 158a may include polysilicon doped with impurities. The impurities doped in the channel connection patterns 158a may be N-type impurities such as phosphorus, arsenic, etc.

In example embodiments, the channel connection patterns 158a may include a first opening 112a and a second opening 112b. For example, the first opening 112a may correspond to a portion of a trench for forming a common source line, and the second opening 112b may correspond to a portion for forming a dummy channel structure. The first opening 112a may have a width greater than a width of the second opening 112b.

The channel connection pattern 158a may be spaced apart from the supporting layer 108 in the vertical direction. Therefore, the channel connection pattern 158a may not be electrically connected to the supporting layer 108.

In some example embodiments, as shown in FIG. 5, the channel connection patterns 158a may include only the first opening 112a in a portion of the trench for forming the common source line. That is, the channel connection patterns 158a may not include the second opening for forming the dummy channel structure.

The lower insulation layer 106 may be formed on the channel connection patterns 158a to fill a space between the channel connection patterns 158a. The lower insulation layer 106 may include, e.g., silicon oxide.

In example embodiments, the lower insulation layer 106 may be formed on the channel connection pattern 158a to fill the first opening 112a and the second opening 112b. Thus, a an upper surface of the lower insulation layer 106 may have a relatively lower height at the portion of the first opening 112a, so that a recess may be formed at the upper surface of the lower insulation layer 106.

The supporting layer 108 may be formed on the lower insulation layer 106. As the recess is formed at the upper surface of the lower insulation layer 106, a recess may also be formed on an upper portion of the supporting layer 108. That is, the recess may be formed on a portion of the upper surface of the lower insulation layer 106 where the first opening 112a is formed.

When a first gap serving as a space for forming the channel connection pattern 158a is formed by an etching process, the supporting layer 108 may support structures formed on the supporting layer 108. Thus, the supporting layer 108 may include a material having a high etching selectivity with respect to a material to be easily etched in the etching process for forming the first gap. For example, the supporting layer 108 may include a material having a high etching selectivity with respect to silicon nitride.

In example embodiments, a GIDL transistor for erasing stored data in memory cells may be formed at a lowermost portion of a cell string. The GIDL transistor forcibly generates GIDL, and thus holes in pair with electrons may be generated at a gate portion of the GIDL transistor. Further, the holes may be injected into a channel of the cell string to generate reverse bias, so that stored data in the memory cell may be erased.

In example embodiments, the supporting layer 108 may serve or function as a gate electrode of a lowermost transistor of the cell string. That is, the supporting layer 108 may be formed or configured to functions as a gate electrode of the GIDL transistor. Thus, the supporting layer 108 may have conductivity. Also, a thickness of the supporting layer 108 in the vertical direction may be substantially equal to a channel length of the GIDL transistor. Thus, electrical characteristics of the GIDL transistor may be controlled by adjusting the thickness in the vertical direction of the supporting layer 108. For example, the thickness of the supporting layer 108 in the vertical direction may be greater than a thickness of each of gate electrodes 170, formed above the supporting layer 108, in the vertical direction.

In example embodiments, the supporting layer 108 may include polysilicon doped with impurities. The supporting layer 108 may include, e.g., polysilicon doped with N-type impurities such as phosphorous, arsenic, etc. In example embodiments, the impurities included in the supporting layer 108 may be substantially the same as the impurities included in the channel connection pattern 158a.

As described above, the supporting layer 108 and the gate electrode of the GIDL transistor are not separately formed, and one polysilicon layer may serve as both the supporting layer 108 and the gate electrode of the GIDL transistor. Thus, a height of the VNAND flash memory device in the vertical direction may be reduced. Also, a failure and/or defect due to an increasing height of the VNAND flash memory device in the vertical direction may be reduced.

A filling insulation pattern 110 may be further formed to fill the recess of the supporting layer 108. An upper surface of the filling insulation pattern 110 and an upper surface of the supporting layer 108 may be flat and coplanar with each other.

The stacked structure 172 may be formed on the supporting layer 108 and the filling insulation pattern 110. The stacked structure 172 may include insulation layers 120 and the gate electrodes 170 alternately and repeatedly stacked. Each of the gate electrodes 170 included in the stacked structure 172 may serve or may be configured to function as a gate electrode of one of ground selection transistor, cell transistor and cell selection transistor.

For example, at least one gate electrode 170a formed at a lowermost portion of the stacked structure 172 may serve as a gate electrode of the ground selection transistor, and at least one gate electrode 170 formed at an uppermost portion of the stacked structure 172 may serve as a gate electrode of the cell selection transistor. A gate electrode 170 disposed between the gate electrode of the ground selection transistor and the gate electrode of the cell selection transistor may serve as a gate electrode of the cell transistor.

The gate electrode 170 may include a material different from a material of the supporting layer 108. That is, a material of the gate electrode of the GIDL transistor may be different from materials of the gate electrodes 170 of transistors formed above the GIDL transistor.

In example embodiments, the gate electrode 170 may include a barrier layer (not shown) and a gate conductive layer. The gate conductive layer may include a metal having a good step coverage property and a low resistance. The gate conductive layer may include a metal such as tungsten, titanium, tantalum, platinum, etc., and the barrier layer may include a metal nitride such as tungsten nitride, titanium nitride, tantalum nitride, etc.

The channel structure 190 may pass through the stacked structure 172, the supporting layer 108, and the lower insulation layer 106, and may extend into the upper surface of the substrate 100. Thus, the channel structure 190 may contact the substrate 100.

The channel structure 190 may be formed in a channel hole 126a (refer to FIG. 8) passing through the stacked structure 172, the supporting layer 108, and the lower insulation layer 106 and extending into the upper surface of the substrate 100.

In example embodiments, the channel hole 126a may have a sloped sidewall so that a width of the channel hole 126a may gradually decrease from an upper portion of the channel hole 126a toward a lower portion of the channel hole 126a. Thus, the channel structure 190 may also have a sloped sidewall so that a width of the channel structure 190 may gradually decrease from an upper portion of the channel structure 190 toward a lower portion of the channel structure 190.

In some example embodiments, as shown in FIG. 4, the sidewall slope of the channel hole 126a may become greater at a portion adjacent to the supporting layer 108 so that the sloped sidewall of the channel hole 126a may be bent at the portion adjacent to the supporting layer 108. Thus, the channel hole 126a at a level below the supporting layer 108 may have a relatively smaller width.

The channel structure 190 may include a charge storage structure 135, a channel 136, and a filling pattern 138. The channel structure 190 may further include a capping pattern 140 formed at an upper portion the channel hole 126a. The capping pattern 140 may contact the channel 136.

The charge storage structure 135 may include a tunnel insulation pattern 134, a charge storage pattern 132, and a blocking pattern 130 that may be sequentially stacked on an outer wall of the channel 136. The tunnel insulation pattern 134 and the blocking pattern 130 may include silicon oxide, and the charge storage pattern 132 may include silicon nitride.

The charge storage structure 135 may be formed on an upper sidewall of the channel hole 126a that is positioned at a level higher than the channel connection pattern 158a. Also, a portion of the charge storage structure 135 may remain at a portion of the channel hole 126a extended into the substrate 100.

In example embodiments, the channel 136 may have a cylindrical shape in the channel hole 126a. In example embodiments, the channel 136 may have a tapering cylindrical shape, of which a diameter becomes smaller in a downward direction, in the channel hole 126a. Hereafter, example embodiments describe the channel having the tapering cylindrical shape. The channel 136 may contact the charge storage structure 135 and the channel connection pattern 158a.

In example embodiments, a bottom of an inner space of the channel 136 may be disposed at a level between an upper surface of the supporting layer 108 and a lower surface of the lowermost gate electrode 170a. A lower portion of the channel 136 having the tapering cylindrical shape may have a thickness in the vertical direction greater than a thickness of the sidewall of the channel 136 in a lateral direction.

The lower portion of the channel 136 may fill a lower portion of the channel hole located below the upper surface of the supporting layer 108, and an upper portion of the channel 136 may be conformally formed on the sidewall of the channel hole. A width of the lower portion of the channel 136 in the lateral direction may be greater than the thickness of the sidewall of the channel 136 in the lateral direction.

The lower portion of the channel 136 may be electrically connected to the substrate 100 by the channel connection pattern 158a. A contact portion between the channel 136 and the channel connection pattern 158a may be positioned at a level below a lower surface of the supporting layer 108. Also, the charge storage structure 135 may be removed at the contact portion between the channel 136 and the channel connection pattern 158a.

The lower portion of the channel 136 may serve as a channel region of the GIDL transistor. Also, the upper portion of the channel 136 may serve as channel regions of the ground selection transistor, the cell transistor, and the cell selection transistor. Thus, the channels 136 of the ground selection transistor, the cell transistor, and the cell selection transistor and the channel 136 of the GIDL transistor may have different shapes and different widths. The lower portion of the channel 136 serving as the channel region of the GIDL transistor may have a pillar shape.

In example embodiments, the lower portion of the channel 136 serving as the channel region of the GIDL transistor may be doped with impurities. That is, a portion of the channel 136 under the lowermost gate electrode 170*a* may be selectively doped with impurities. However, the upper portion of the channel 136 may not be doped with impurities. The impurities doped in the lower portion of the channel 136 may be N-type impurities such as phosphorus, arsenic, etc. The impurities may be substantially the same as the impurities doped in the channel connection pattern.

In a polysilicon formed as the channel 136, a grain size is greater at a wide portion of the polysilicon than at a narrow portion thereof. As the grain size of the polysilicon increases, a diffusion of impurities may be easily controlled. Thus, impurities may be sufficiently doped at the lower portion of channel 136 having a relatively wide width and having a greater grain size, but impurities are not doped in the upper portion of the channel 136 having a relatively narrow width and having a smaller grain size. Therefore, the GIDL current generated at the GIDL transistor may increase, and thus, an erase voltage of a stored data in the memory cell may decrease.

The filling pattern 138 may be formed on the channel 136 to fill the channel hole. The filling pattern 138 may include an insulation material. The insulation material may include, e.g., silicon oxide.

The capping pattern 140 may include, e.g., polysilicon. The capping pattern 140 may serve as a pad for contacting upper wirings (not shown).

The dummy channel structure 190*a* may pass through the stacked structure 172, the supporting layer 108 and the lower insulation layer 106, and may extend to the upper portion of the substrate 100. The dummy channel structure 190*a* may be formed in a dummy channel hole (FIGS. 8 and 126*b*) passing through the stacked structure 172, the supporting layer 108, and the lower insulation layer 106 and extending to the upper portion of the substrate 100. In example embodiments, the dummy channel hole 126*b* may have a sloped sidewall so that a width may gradually decrease from an upper portion of the dummy channel hole toward a lower portion of the dummy channel hole. Thus, the dummy channel structure 190*a* may also have a sloped sidewall so that a width may gradually decrease from an upper portion of the dummy channel structure 190*a* toward a lower portion of the dummy channel structure 190*a*.

The dummy channel structure 190*a* may include a charge storage structure 135, a dummy channel 136*a*, and a filling pattern 138. Also, a capping pattern 140 may be formed at an upper portion of the dummy channel hole, and the capping pattern 140 may contact the dummy channel 136*a*.

In example embodiments, the dummy channel structure 190*a* may pass through lower insulation layer 106 in the second opening 112*b*, and may extend to the substrate 100. In example embodiments, the dummy channel 136*a* may not contact the channel connection pattern 158*a*. A lower sidewall of the dummy channel structure 190*a* may contact the lower insulation layer 106. Thus, the dummy channel structure 190*a* may be electrically isolated from the substrate 100. The dummy channel structure 190*a* may not operate as an actual memory cell. Also, the dummy channel structure 190*a* may not be electrically connected to the channel structure 190. Thus, even if failures and/or damages of the dummy channel structure 190*a* are generated, the channel structure 190 may not be electrically affected.

In some example embodiments, as shown in FIG. 5, the dummy channel structure 190*a* may have a shape substantially the same as a shape of the channel structure 190. In this case, the dummy channel 136*a* included in the dummy channel structure 190*a* may contact the channel connection pattern 158*a*.

The common source lines 182 may pass through the stacked structure 172, the supporting layer 108 and the lower insulation layer 106 so that at least a portion of a bottom of the common source lines 182 may contact an upper surface of the substrate 100. Also, the common source lines 182 may extend in the first direction.

The stacked structure 172 and the supporting layer 108 may be formed between the common source lines 182. Thus, the supporting layer 108 and the stacked structure 172 may have a line shape extending in the first direction.

The common source line 182 may include, e.g., a barrier metal layer (not shown) and a metal pattern. The barrier metal layer may include a metal nitride such as tungsten nitride, titanium nitride, tantalum nitride, etc. The metal pattern may include a metal having a low electrical resistance such as tungsten, titanium, tantalum, platinum, etc.

A spacer 180 including an insulation material may surround a sidewall of the common source line 182. In example embodiments, the insulation material may include silicon oxide.

The stacked structure 172 and the supporting layer 108 may contact the spacer 180. Thus, the gate electrode 170 included in the stacked structure 172 and the common source line 182 may be electrically isolated by the spacer 180, and the supporting layer 108 and the common source line 182 may also be electrically isolated by the spacer 180.

In example embodiments, the common source line 182 may pass through the lower insulation layer 106 in the first opening 112*a*, and may extend to the substrate 100. Thus, the common source line 182 disposed in the first opening 112*a* may be spaced apart from the channel connection pattern 158*a*.

In the vertical semiconductor device, the supporting layer 108 may be used as the gate electrode of the GIDL transistor, so that the height of the vertical semiconductor device may decrease. Also, the width of the channel region of the GIDL transistor may increase. Thus, the GIDL current generated at the GIDL transistor may increase, and thus, the erase voltage of a stored data in the memory cell may decrease.

FIGS. 6 to 22 are plan views and cross-sectional views illustrating stages of a method of manufacturing a vertical semiconductor device in accordance with example embodiments.

Figure 6:
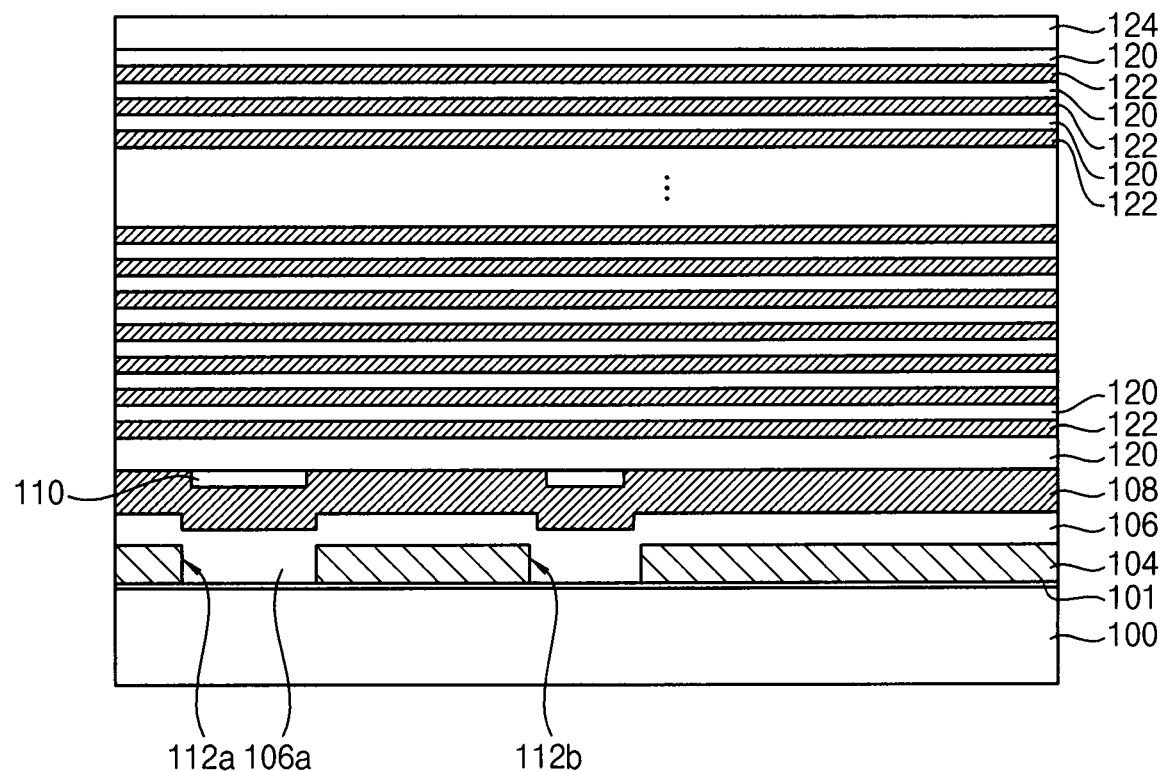
Figure 7:
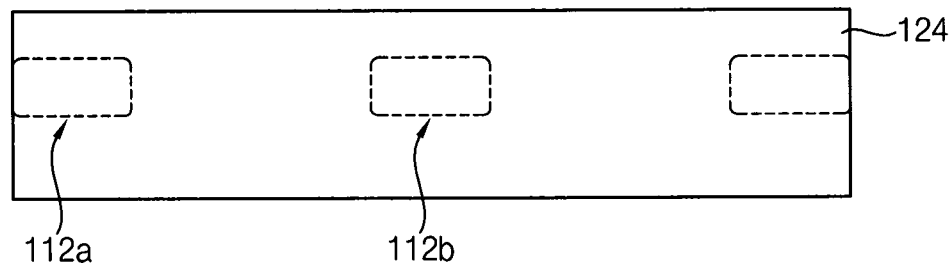

Referring to FIGS. 6 and 7, a pad layer 101 may be formed on a substrate 100. A first sacrificial pattern 104 may be formed on the pad layer 101, and a lower insulation layer 106 and a supporting layer 108 may be sequentially formed on the first sacrificial pattern 104 and the pad layer 101.

The pad layer 101 may include silicon oxide.

The first sacrificial pattern 104 may be formed by depositing a first sacrificial layer on the pad layer 101 and patterning the first sacrificial layer. In example embodiments, in the patterning process, the first sacrificial layer disposed at a portion in a trench for forming a common source line and the first sacrificial layer disposed at a portion for forming a dummy channel structure may be removed to form the first sacrificial pattern 104. In this case, the first sacrificial pattern 104 may include a first opening 112*a* at the portion in the trench for forming the common source line and a second opening 112b at the portion for forming the dummy channel structure. A width of the first opening 112a may be greater than a width of the second opening 112b.

In some example embodiments, in the patterning process, the first sacrificial layer disposed at the portion in the trench for forming the common source line may be removed to form the first sacrificial pattern 104. In this case, the first sacrificial pattern 104 may include the first opening 112a at the portion in the trench for forming the common source line. However, the second opening 112b may not be formed at the portion for forming the dummy channel structure. Therefore, when subsequent processes are performed in the same manner for the first sacrificial pattern 104 including only the first opening 112a, a shape of the dummy channel structure may be substantially the same as a shape of the channel structure. Thus, the semiconductor device shown in FIG. 5 may be manufactured.

The first sacrificial pattern 104 may include a material having a high etching selectivity with respect to each of silicon oxide and polysilicon. For example, first sacrificial pattern 104 may include silicon nitride.

The lower insulation layer 106 may be formed on the first sacrificial pattern 104 to fill the first opening 112a and the second opening 112b. The lower insulation layer 106 may include, e.g., silicon oxide. In example embodiments, an upper surface of the lower insulation layer 106 may be relatively lowered in the first opening 112a and the second opening 112b, so that an upper surface of the lower insulation layer 106 may have a recess at a portion corresponding to the first opening 112a and the second opening 112b.

The supporting layer 108 may be formed to support a structure stacked on the supporting layer 108 during a subsequent removing process of the first sacrificial pattern 104. Thus, the supporting layer 108 may include a material having a high etch selectivity with respect to each of the silicon oxide and the silicon nitride.

Also, the supporting layer 108 may serve or may be configured to function as a gate electrode of a GIDL transistor formed at the lowermost portion of the cell string. Thus, the supporting layer 108 may have conductivity. In example embodiments, the supporting layer 108 may include polysilicon doped with N-type impurities such as phosphorous, arsenic, etc.

As the supporting layer 108 is formed on the upper surface of the lower insulation layer 106 including the recess, the upper surface of the supporting layer 108 may also have a recess. The recess may be disposed to face the first opening 112a and the second opening 112b.

In example embodiments, a filling insulation pattern 110 may be formed to fill the recess formed on the supporting layer 108. The upper surface of the filling insulation pattern 110 and the upper surface of the supporting layer 108 may be flat and coplanar with each other. The filling insulation pattern 110 may include, e.g., silicon oxide.

Then, insulation layers 120 and second sacrificial layers 122 may be alternately and repeatedly formed on the supporting layer 108 and the filling insulation pattern 110. A first insulating interlayer 124 may be formed on an uppermost insulation layer 120.

The second sacrificial layers 122 may form gate electrodes of a ground selection transistor, a cell transistor, and a cell selection transistor by subsequent processes. As a thickness of the second sacrificial layer 122 increases, a height of the semiconductor device in the vertical direction may increase. Thus, in example embodiments, each of the second sacrificial layers 122 may have a thickness less than a thickness of the supporting layer 108 serving as the gate electrode of the GIDL transistor.

In example embodiments, the insulation layer 120 and the first insulating interlayer 124 may include an oxide, e.g., silicon oxide, and the second sacrificial layer 122 may include a nitride, e.g., silicon nitride.

Figure 8:
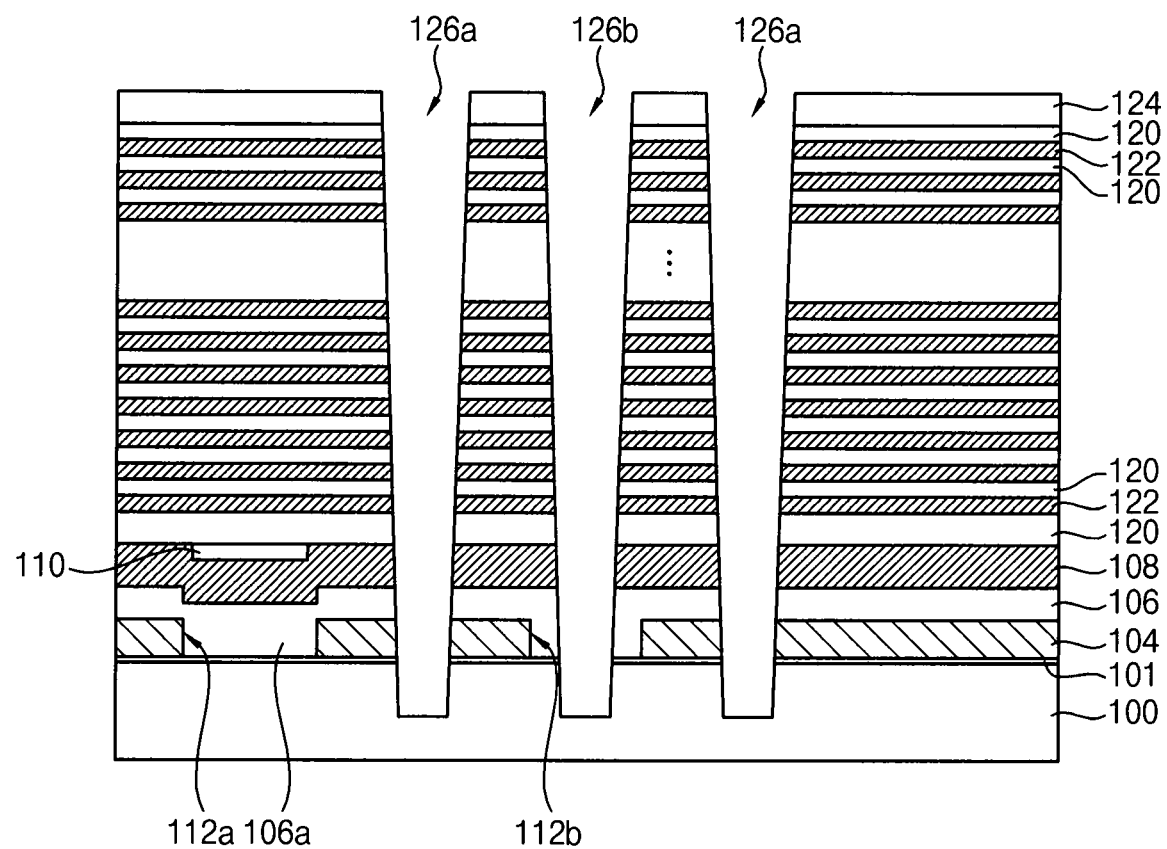
Figure 10:
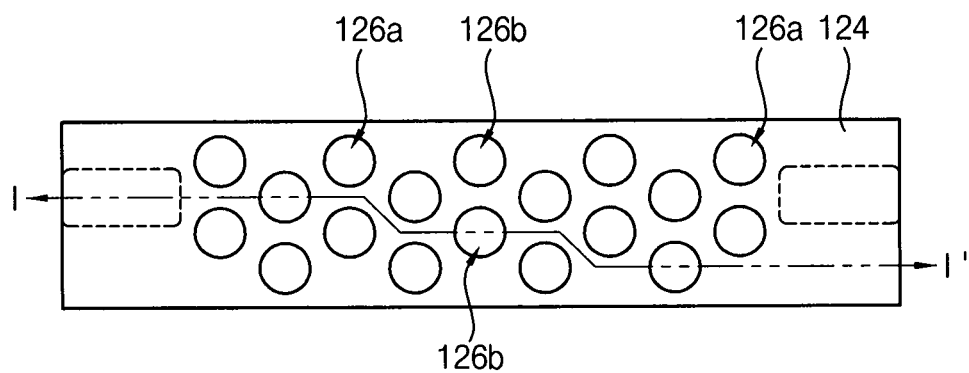

Referring to FIGS. 8 and 10, the first insulating interlayer 124, the insulation layers 120, the second sacrificial layers 122, the supporting layer 108, the lower insulation layer 106, the first sacrificial pattern 104, and the pad layer 101 may be isotropically etched to form channel holes 126a and dummy channel holes 126b.

The channel holes 126a and the dummy channel holes 126b may be formed to extend into a portion under the upper surface of the substrate 100. Thus, bottoms of the channel holes 126a and the dummy channel holes 126b may be lower than the upper surface of the substrate 100.

In example embodiments, each of the channel holes 126a and the dummy channel holes 126b may have a sloped sidewall so that a width of each of the channel holes 126a and the dummy channel holes 126b may gradually decrease from an upper portion toward a lower portion thereof.

Figure 9:
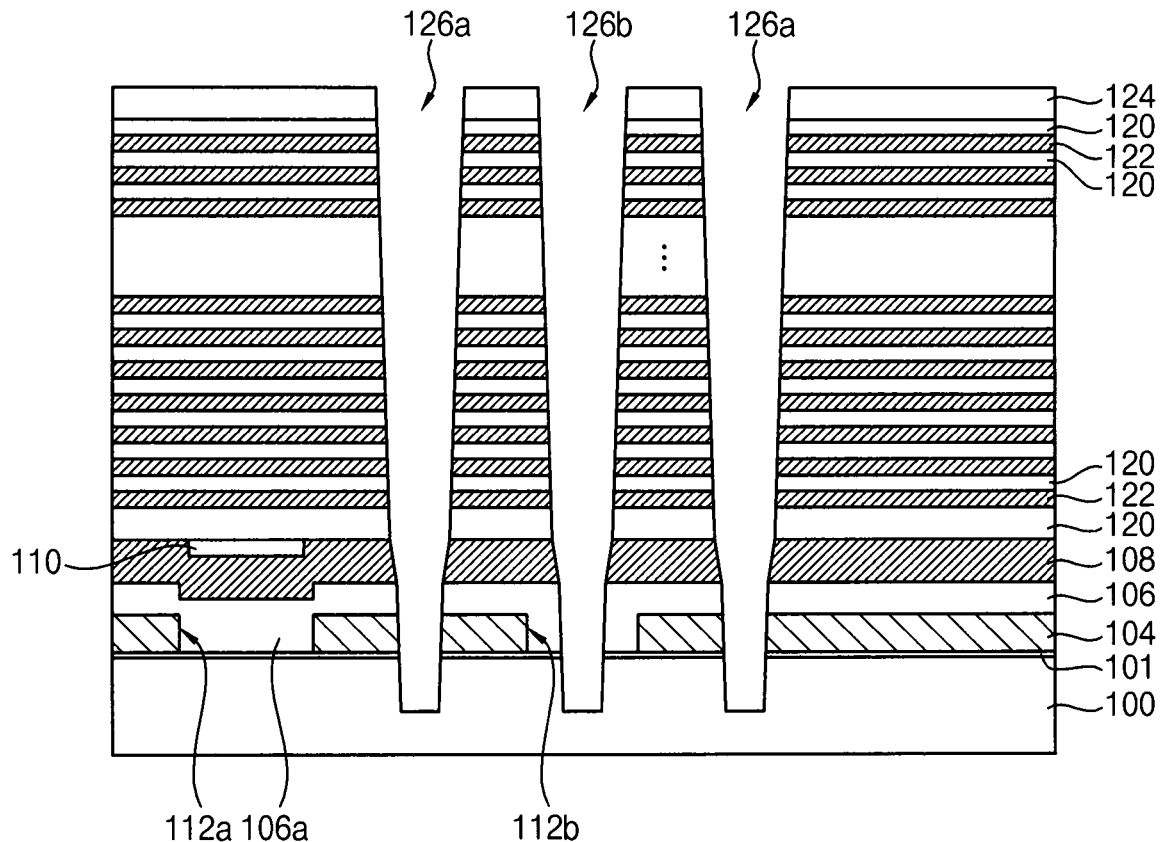

In some example embodiments, as shown in FIG. 9, the sidewall slope of each of the channel holes 126a and dummy channel holes 126b may become greater at a portion adjacent to the supporting layer 108 so that the sloped side wall of each of the channel holes 126a and dummy channel holes 126b may be bent at the portion adjacent to the supporting layer 108. Thus, each of the channel holes 126a and the dummy channel holes 126b under the supporting layer 108 may have a relatively smaller width. In this case, the semiconductor devices shown in FIG. 4 may be manufactured by performing subsequent processes in the same manner.

In example embodiments, the channel holes 126a may serve as a space for forming the channel structure constituting a memory cell string, and the dummy channel holes 126b may serve as a space for forming the dummy channel structure constituting a dummy cell string. The channel hole 126a may pass through the first sacrificial pattern 104, and thus, the first sacrificial pattern 104 may be exposed by the lower sidewall of the channel hole 126a. Meanwhile, the dummy channel hole 126b may pass through the portion of the second opening 112b between the first sacrificial patterns 104, so that the lower insulation layer 106 may be exposed by the lower sidewall of the dummy channel hole 126b. That is, the first sacrificial pattern 104 may not be exposed by the sidewall of the dummy channel hole 126b.

In some example embodiments, the channel structure and the dummy channel structure may be formed to have substantially the same shape. In this case, the first sacrificial pattern 104 may not include the second opening 112b. Thus, each of the channel holes 126a and the dummy channel holes 126b may pass through the first sacrificial pattern 104, so that the first sacrificial pattern 104 may be exposed by the lower sidewalls of the channel holes 126a and the dummy channel holes 126b.

Figure 11:
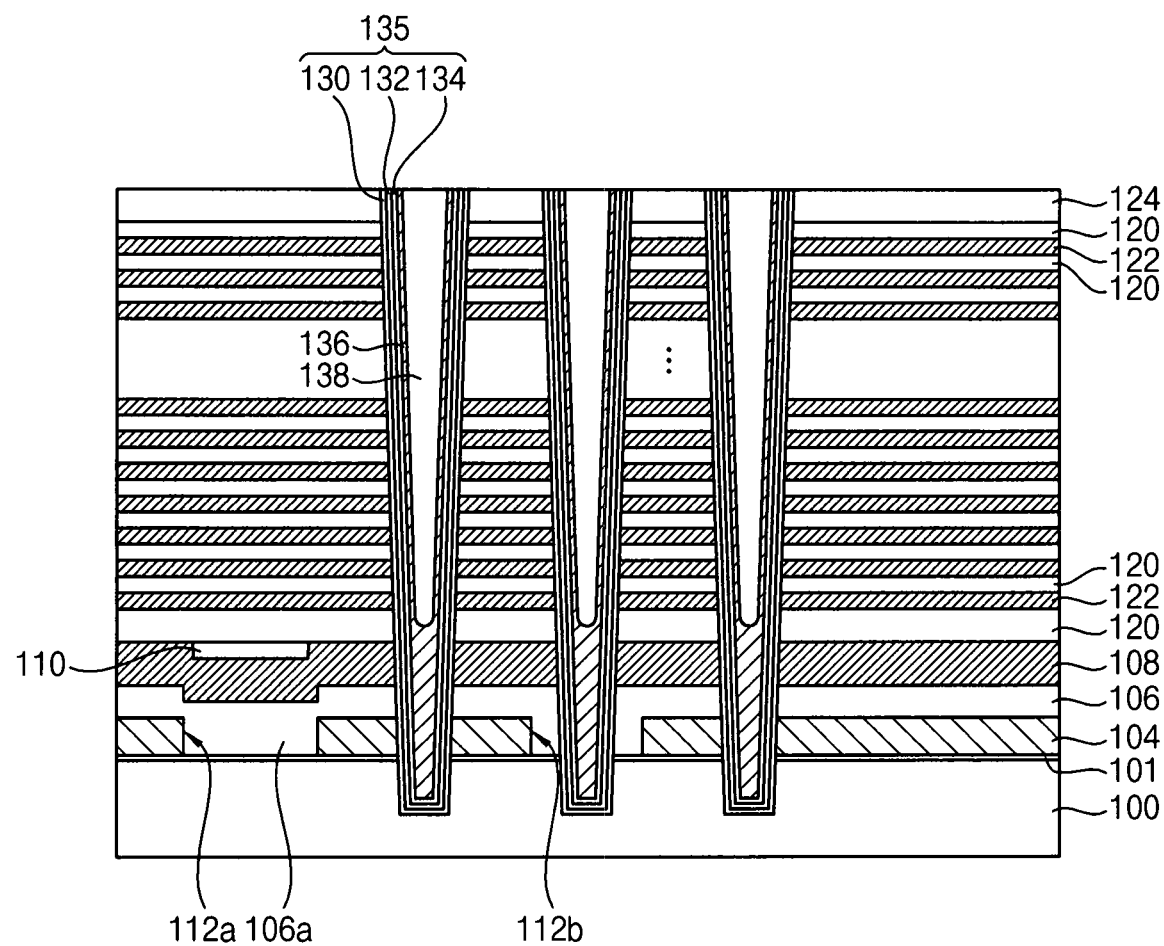

Referring to FIG. 11, a charge storage structure 135, a channel 136, and a filling pattern 138 may be formed in each of the channel holes 126a and the dummy channel holes 126b.

Particularly, a charge storage structure layer may be formed on sidewalls and bottoms of the channel holes 126a and the dummy channel holes 126b and on an upper surface of the first insulating interlayer 124. The charge storage structure layer may include a first blocking layer, a charge storage layer, and a tunnel insulation layer sequentially stacked. For example, the first blocking layer, the charge storage layer, and the tunnel insulation layer may include silicon oxide, silicon nitride, and silicon oxide, respectively.

A channel layer may be conformally formed on the charge storage structure layer. The channel layer may include undoped polysilicon.

Each of the channel holes 126a and the dummy channel holes 126b may include a lower portion positioned at a level below a bottom of a lowermost second sacrificial layer 122 and an upper portion positioned at a level above the bottom of the lowermost second sacrificial layer 122. The channel layers formed on lower sidewalls of each of the channel holes 126a and the dummy channel holes 126b having a relatively small width may contact each other. Thus, the channel layer in each of the channel holes 126a and the dummy channel holes 126b may have a folded shape. The channel layer may fill a lower portion of each of the channel holes 126a and the dummy channel holes 126b. That is, the channel layer formed on the tunnel insulation layer may have a tapering cylindrical shape formed along inner surfaces of the channel holes 126a and the dummy channel holes 126b. A bottom of an inner space of the channel layer having the tapering cylindrical shape may be disposed at a level between the upper surface of the supporting layer 108 and a lower surface of the lowermost second sacrificial layer 122.

In example embodiments, a lowermost insulation layer 120 between the upper surface of the supporting layer 108 and the lowermost second sacrificial layer 122 may be formed to have a thickness greater than thicknesses of other insulation layers 120 thereon. In this case, a margin (or range) of a portion where an upper surface of a folding portion of the channel layer is located may increase.

Thereafter, a filling insulation layer may be formed on the channel layer to fill remaining portions of the channel holes 126a and the dummy channel holes 126b. Then, the filling insulation layer, the channel layer and the charge storage structure layer may be planarized until an upper surface of the first insulating interlayer 124 may be exposed.

Thus, the charge storage structure 135 and the channel 136 may be formed on sidewalls of the channel holes 126a and the dummy channel holes 126b and the upper surface of the substrate 100, and the filling pattern 138 may be formed on the channel 136 to fill the inner space of the channel 136. The charge storage structure 135 may include a blocking pattern 130, a charge storage pattern 132, and a tunnel insulation pattern 134.

As described above, the bottom of the inner space of the channel 136 may be positioned at a level between the upper surface of the supporting layer 108 and the lowermost second sacrificial layer 122. Thus, a width of a folding portion of the channel may be greater than a width of an upper portion above the folding portion of the channel 136. As the supporting layer 108 serves or is configured to function as a gate electrode of a GIDL transistor, the folding portion of the channel 136 may serve or may be configured to function as a channel region of the GIDL transistor.

Meanwhile, the portion of the channel 136 contacting the second sacrificial layers 122 may not be folded. Therefore, the channels 136 of the ground selection transistor, the cell transistor, and the cell selection transistor and the channel 136 of the GIDL transistor may have different shapes and different widths. That is, a width of the channel 136 at a level below the upper surface of the supporting layer 108 may be greater than a width of a sidewall of the channel 136 having a tapering cylindrical shape. In addition, a thickness of the bottom of the channel 136 may be greater than the thickness of the sidewall of the channel 136.

Figure 12:
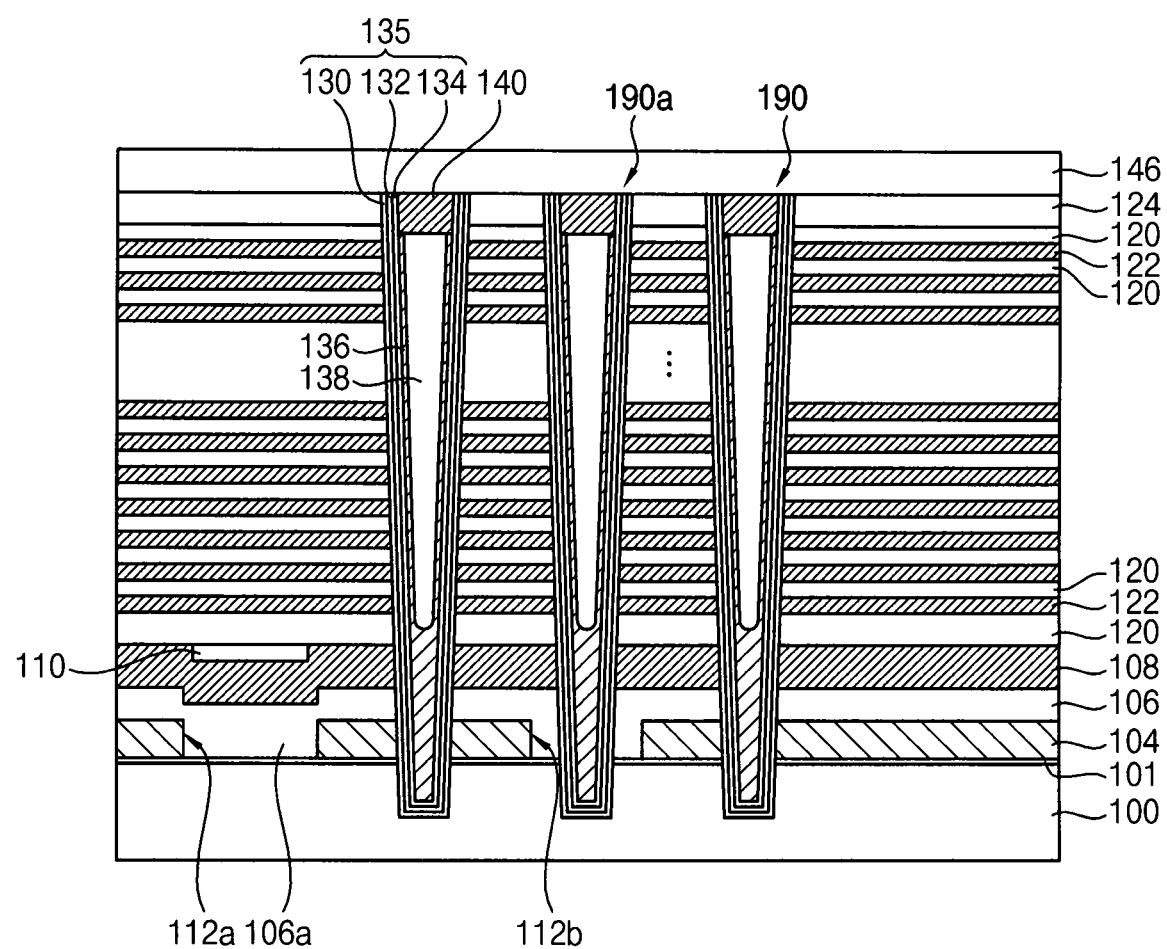

Referring to FIG. 12, upper portions of the filling pattern 138 and the channel 136 may be removed to form a recess, and a capping pattern 140 may be formed in the recess. The capping pattern 140 may include, e.g., polysilicon.

A second insulating interlayer 146 may be formed on the first insulating interlayer 124 and the capping pattern 140.

Figure 13:
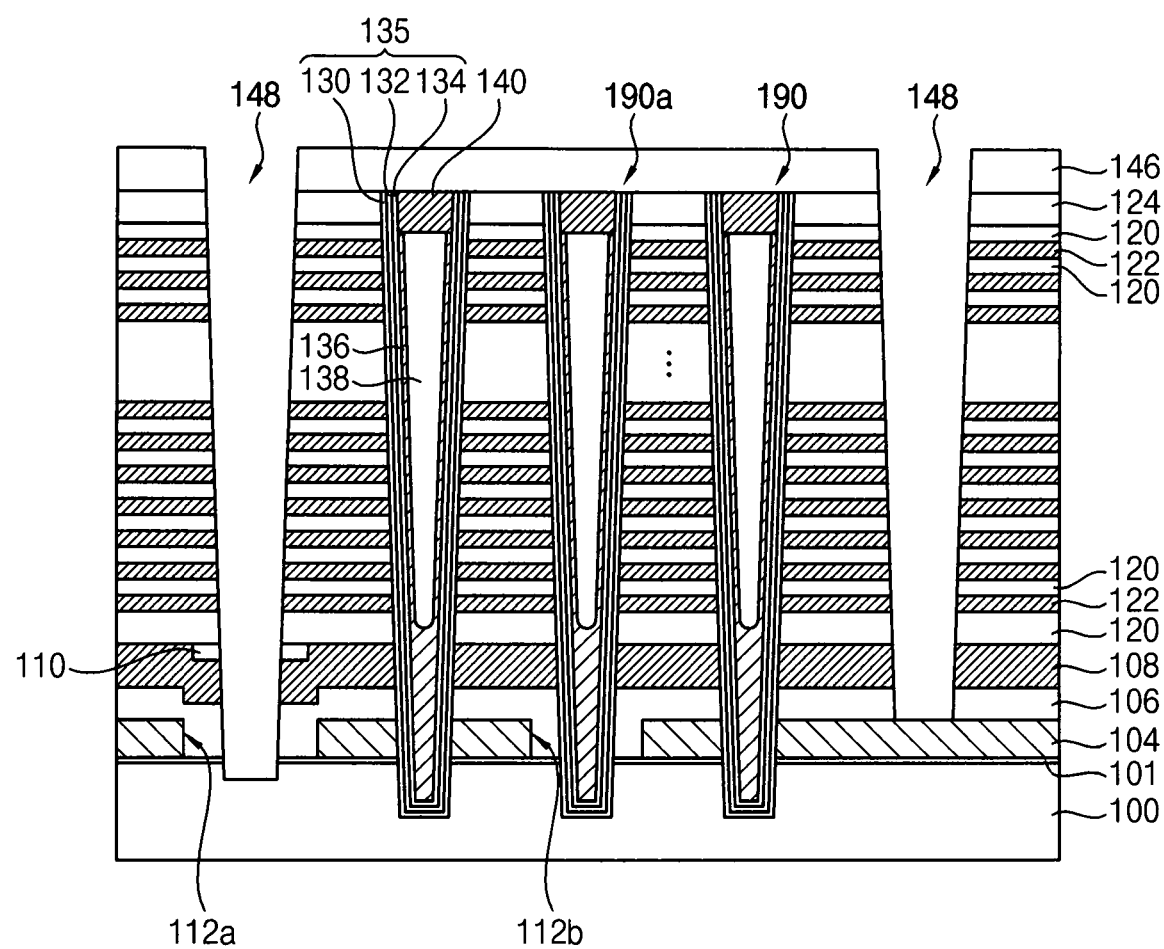

Referring to FIG. 13, the first insulating interlayer 124 and the second insulating interlayer 146, the second sacrificial layers 122, the insulation layers 120, the supporting layer 108, and the lower insulation layer 106 may be anisotropically etched to form a trench 148 therethrough. The trench 148 may extend in a first direction.

In example embodiments, a bottom of the trench 148 may expose an upper surface of the first sacrificial pattern 104. Also, a portion of the bottom of the trench 148 may expose a surface of the substrate 100. That is, the trench 148 formed at the first opening 112a may expose the surface of the substrate 100.

Figure 14:
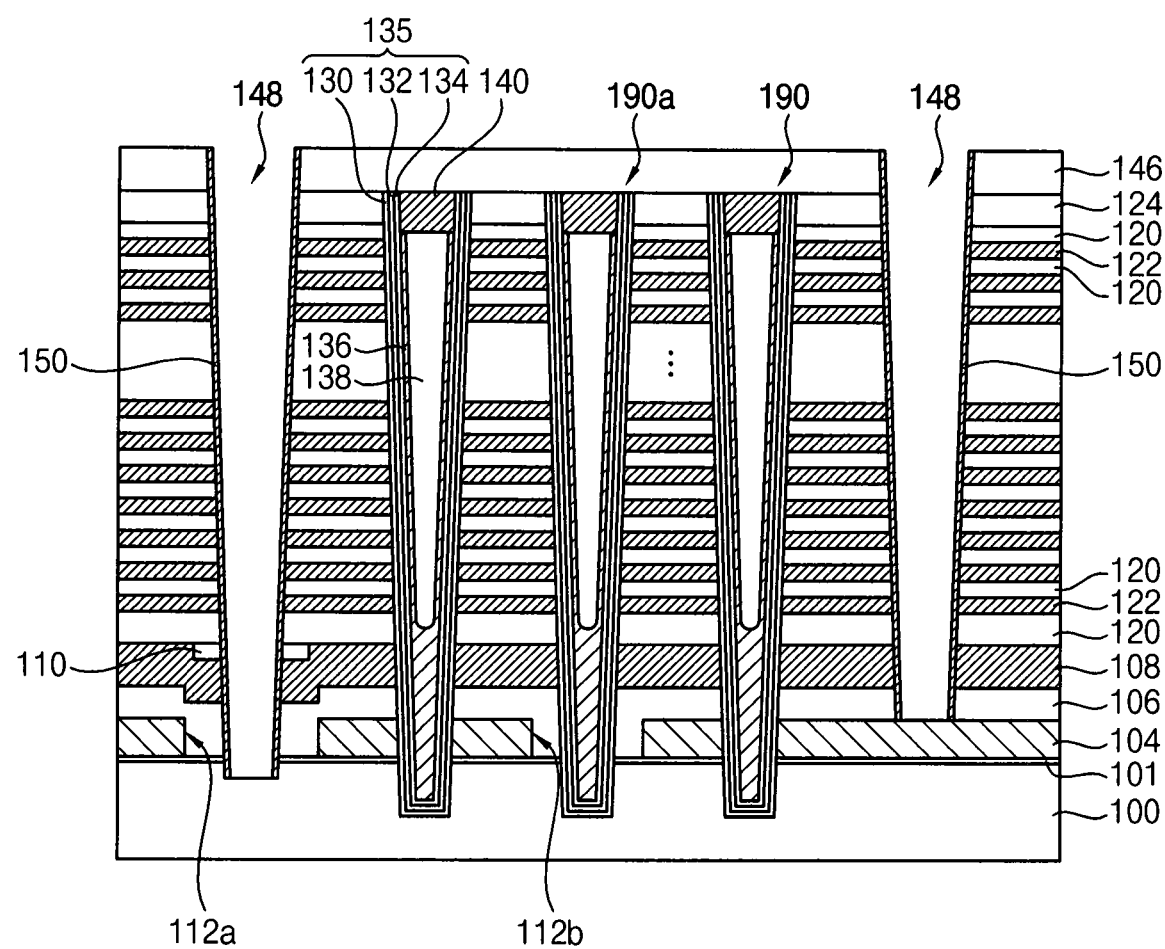

Referring to FIG. 14, a first spacer 150 may be formed on a sidewall of the trench 148. The first spacer 150 may include, e.g., polysilicon.

The first spacer 150 may cover the second sacrificial layers 122 and the supporting layer 108 exposed by the sidewall of the trench 148. Thus, the second sacrificial layers 122 and the supporting layer 108 may not be exposed by the trench 148.

Figure 15:
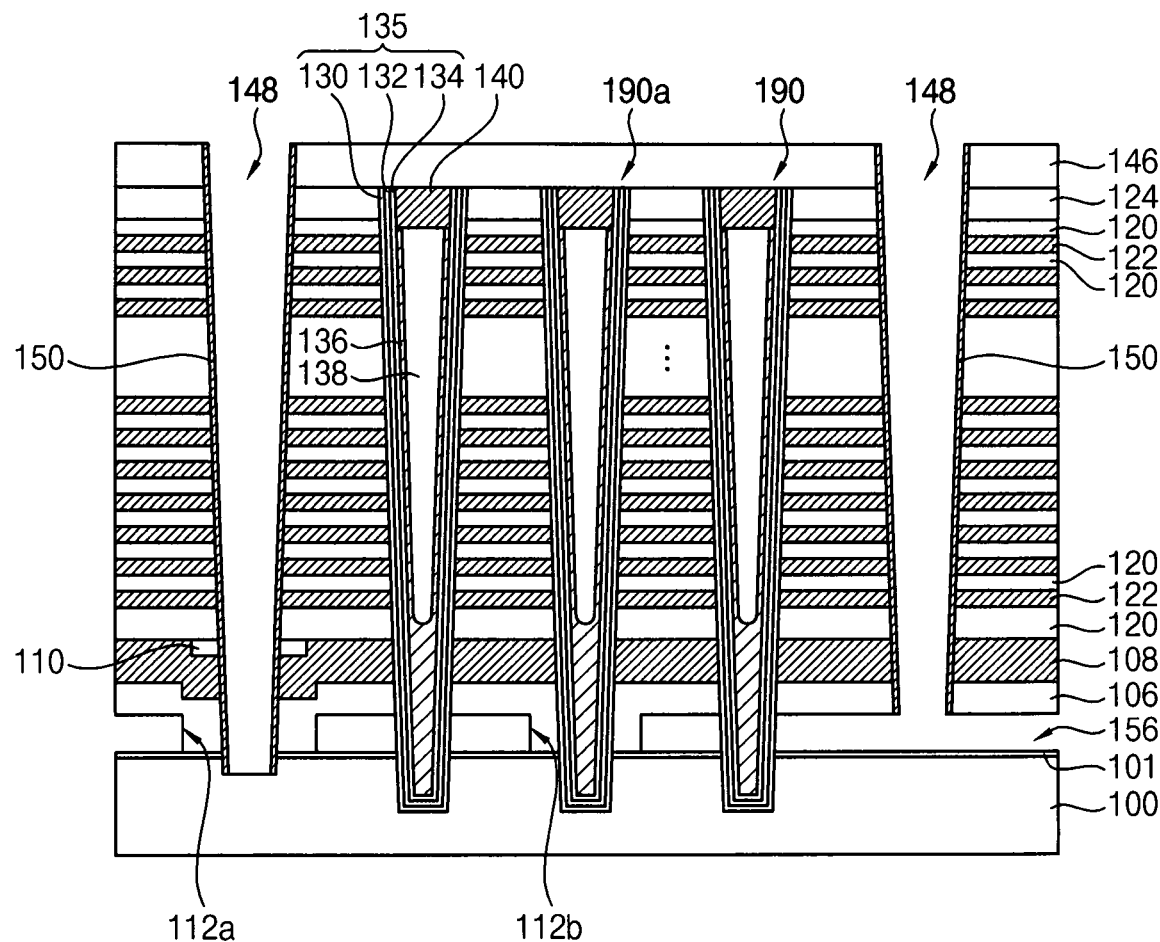
Figure 16:
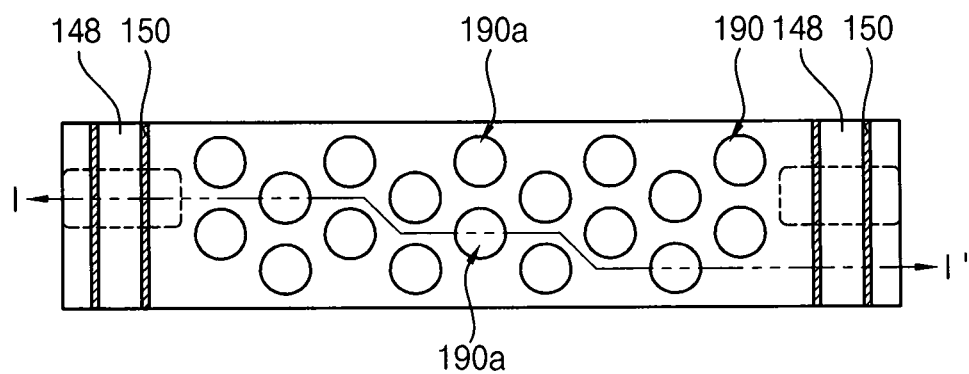

FIGS. 15 and 16, the first sacrificial pattern 104 exposed by the bottom of the trench 148 may be removed. At this time, oxide or polysilicon except for the first sacrificial pattern 104 may not be removed. Therefore, a preliminary first gap 156 may be formed at a portion where the first sacrificial pattern 104 is removed. A bottom of the lower insulation layer 106 and a portion of a sidewall of the blocking pattern 130 may be exposed by the preliminary first gap 156.

In example embodiments, the first sacrificial pattern 104 may be removed by a wet etching process. In example embodiments, although the preliminary first gap 156 may be formed by the wet etching process, a structure formed on the supporting layer 108 may be supported by the supporting layer 108, the lower insulation layer 106, the channel structure 190, and the dummy channel structure 190a.

Figure 17:
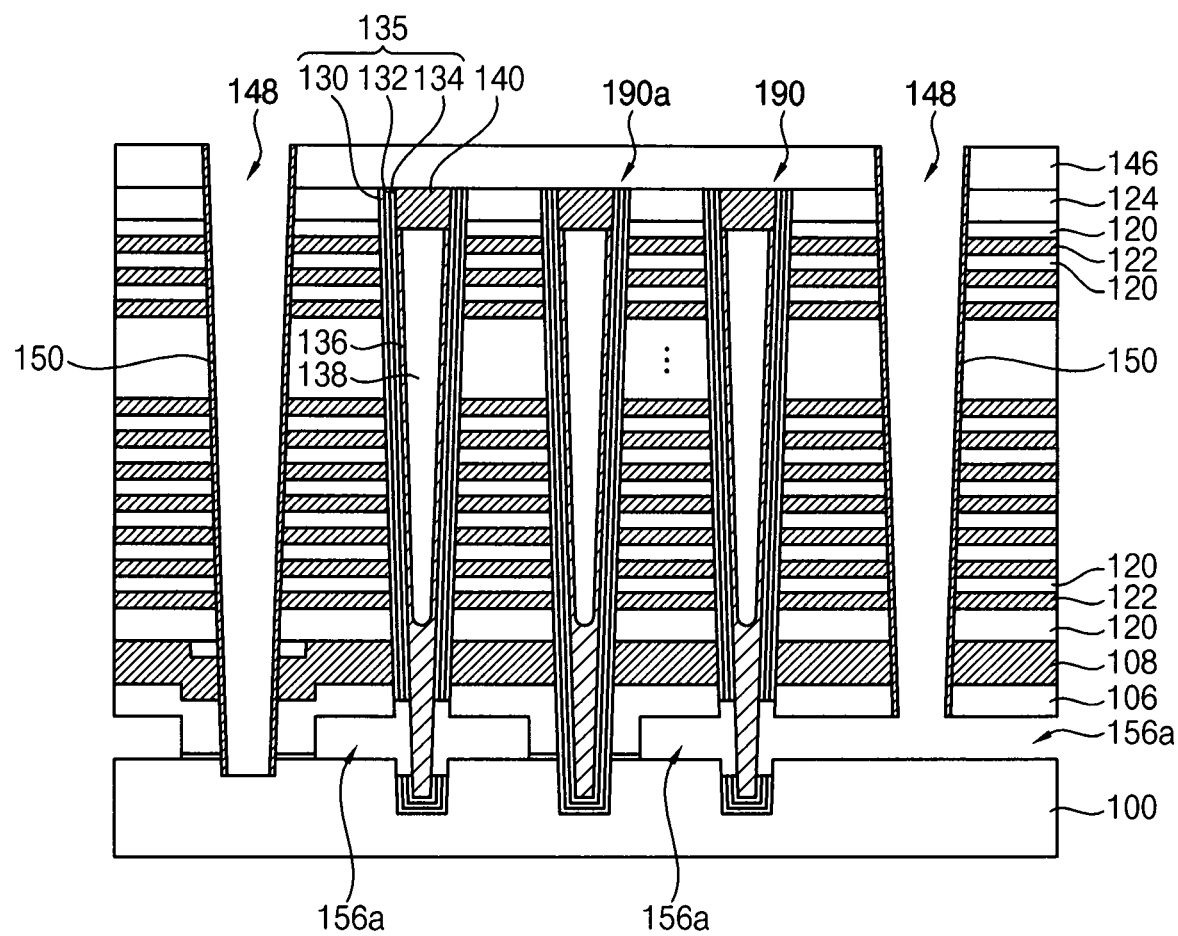

Referring to FIG. 17, the blocking pattern 130 exposed by the preliminary first gap 156, the charge storage pattern 132, and the tunnel insulation pattern 134 may be wet etched. Thus, an outer wall of the lower portion of the channel 136 may be partially exposed. Also, in the etching process of the blocking pattern 130 and the tunnel insulation pattern 134, the pad layer 101 formed on the substrate 100 may be removed together. The preliminary first gap 156 may be transformed to a first gap 156a exposing the substrate 100 by the etching process.

The wet etching process may be an isotropic etching process. Thus, a portion of the charge storage structure 135 directly exposed by the preliminary first gap 156 may be etched, and then, the charge storage structure 135 may be further etched in the vertical direction. In this case, the charge storage structure 135 on the sidewalls of the supporting layer 108 may not be removed, and may remain. Thus, the channel 136, the charge storage structure 135, and the supporting layer 108 may be sequentially stacked in a lateral direction. Meanwhile, a portion of the substrate 100 may be exposed by the first gap 156a formed by partially etching the charge storage structure 135.

In example embodiments, the charge storage structure 135 formed in the dummy channel hole 126b may be covered by the lower insulation layer 106, and may not be exposed. Thus, the charge storage structure 135 in the dummy channel hole 126b may not be removed by the etching process.

Figure 18:
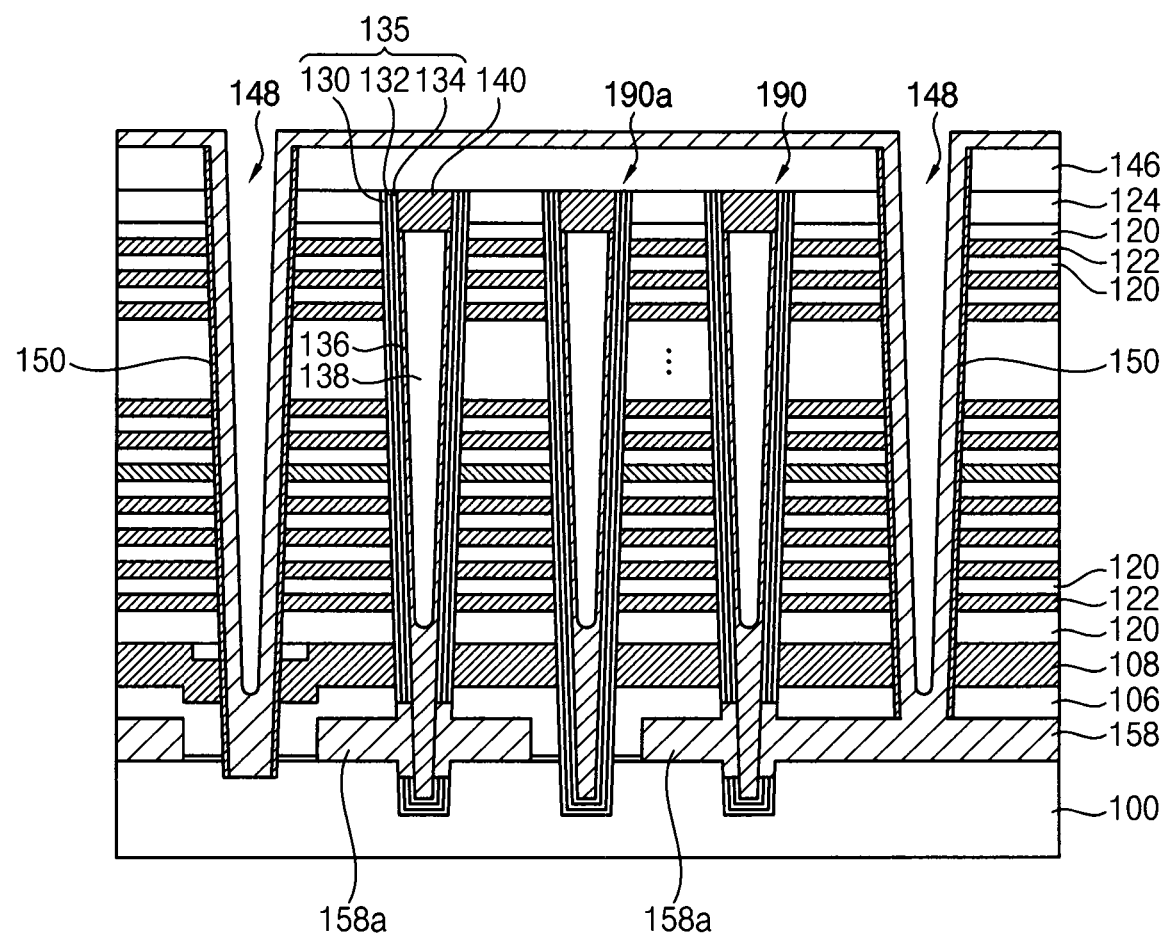

Referring to FIG. 18, a channel connection layer 158 may be formed to fill the first gap 156a. The channel connection layer 158 may also be formed on the sidewall and the bottom of the trench 148 and the upper surface of the second insulating interlayer 146.

The channel connection layer 158 may include polysilicon doped with impurities. The channel connection layer 158 may be doped with N-type impurities such as phosphorous, arsenic, etc.

Figure 19:
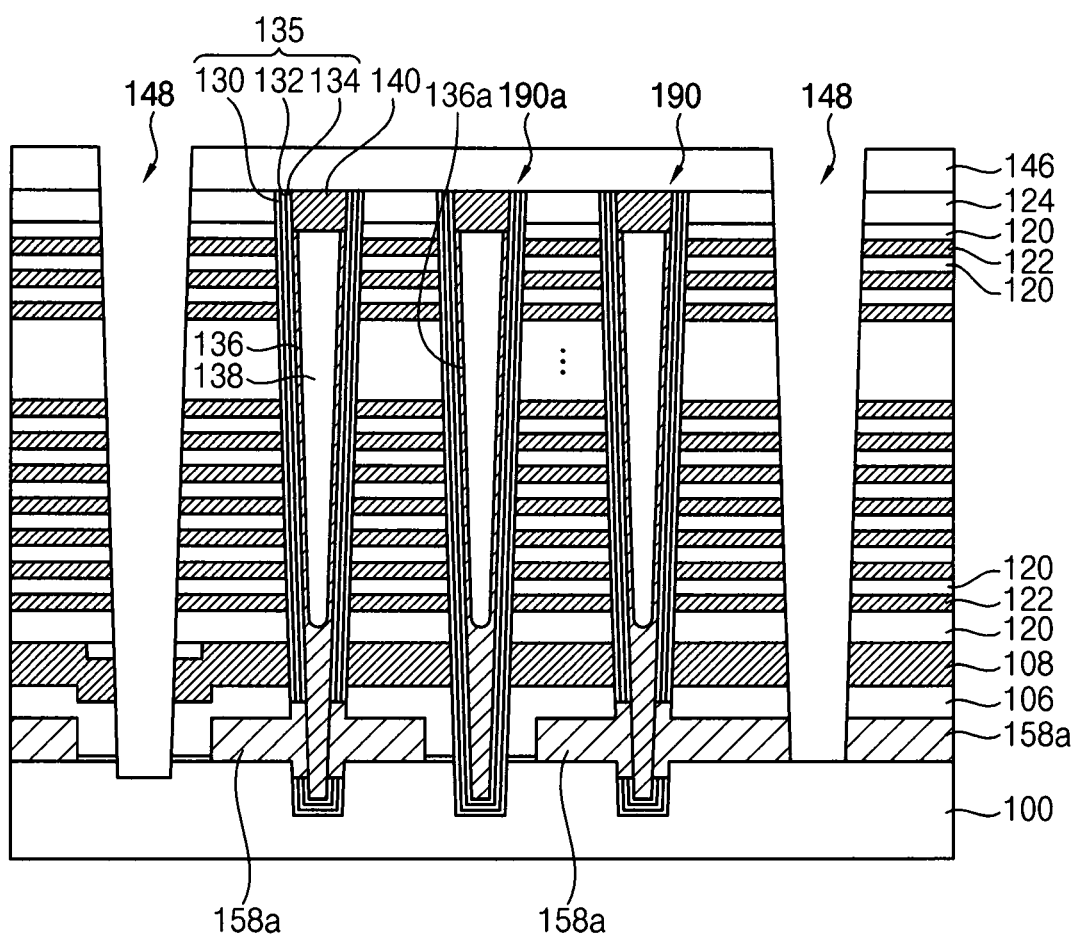

Referring to FIG. 19, the channel connection layer 158 may be partially removed to form a channel connection pattern 158a filling only the first gap 156a.

In example embodiments, the channel connection layer 158 formed at the trench 148 and the second insulating interlayer 146 may be etched by an etch-back process to form the channel connection pattern 158a.

As the channel connection pattern 158a is formed, the channel 136 may be electrically connected to the substrate 100.

The channel connection pattern 158a may directly contact the lower portion of the channel 136, so that the impurities included in the channel connection pattern 158a may be diffused to the lower portion of the channel 136 during subsequent processes performed at a heating atmosphere. Therefore, the impurities included in the channel connection pattern 158a may be diffused to the channel region of the GIDL transistor, so that the channel region of the GIDL transistor may be doped with the impurities. Therefore, the impurity doped in the lower portion of the channel 136 may be substantially the same as the impurity doped in the channel connection pattern 158a.

However, the impurities may not be doped into the channel regions of the ground selection transistor and transistors formed above the ground selection transistor. Therefore, the impurities included in the channel connection pattern 158a may be controlled so that the impurities may not be excessively diffused upward.

The width of the polysilicon at the folding portion of the channel 136 may be greater than the width of the polysilicon at other portions, and thus, a grain size of the polysilicon at the folding portion may be greater than a grain size of the polysilicon at other portions. Thus, the impurities may be sufficiently doped to the lower portion of the channel 136 corresponding to the folding portion, and the upper portion of the channel 136 may not be doped or less doped. Therefore, the GIDL current generated at the GIDL transistor may increase, and thus, the erase voltage of the data stored in the memory cell may be reduced.

A channel structure 190 may be formed in the channel hole 126a, and the dummy channel structure 190a may be formed in the dummy channel hole 126b. The dummy channel 136a included in the dummy channel structure 190a may be electrically isolated from the substrate 100. Therefore, the dummy channel structure 190a may not operate as a real memory cell. The dummy channel structure 190a may not be electrically connected to the channel structure 190. Thus, even if a failure or damages of the dummy channel structure 190a is generated, the channel structure 190 may not be affected.

Figure 20:
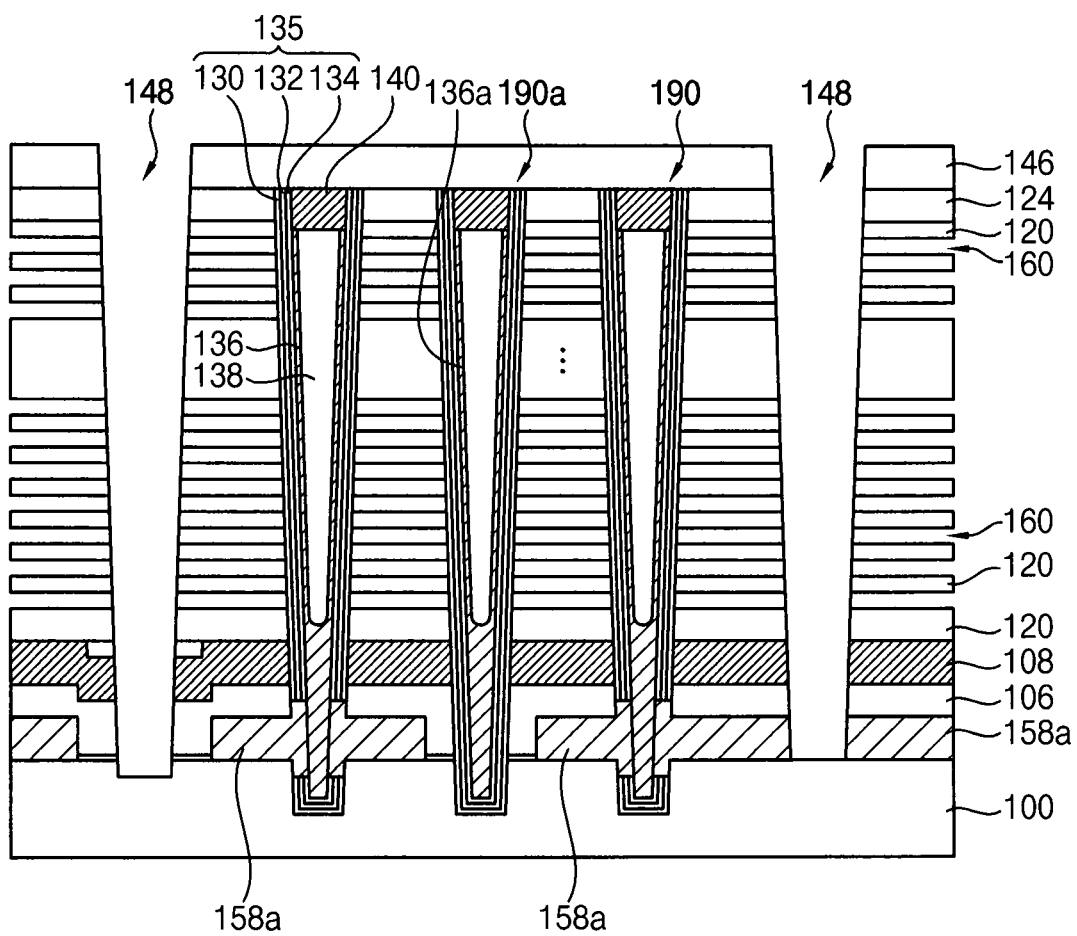

Referring to FIG. 20, the second sacrificial layers 122 exposed by the trench 148 may be removed to form second gaps 160 between the insulation layers 120. A portion of the outer wall of the blocking pattern 130 may be exposed by the second gap 160. The removing process of the second sacrificial layers 122 may be a wet etching process.

Figure 21:
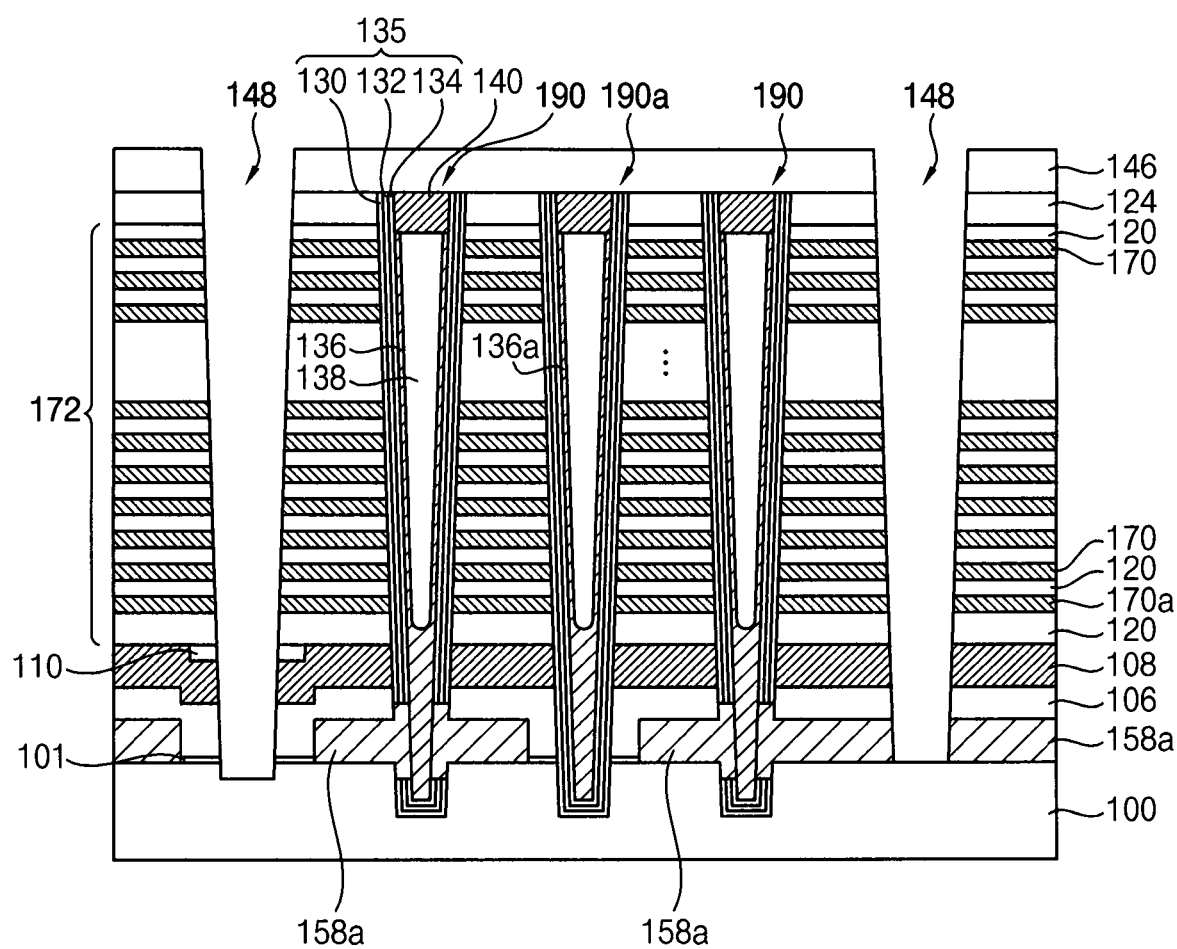

Referring to FIG. 21, a second blocking layer (not shown) may be formed along the surfaces of the trench 148 and the second gaps 160, and a gate electrode layer may be formed on the second blocking layer to fill the second gap 160.

In example embodiments, the gate electrode layer may include a barrier layer (not shown) and a gate conductive layer sequentially stacked. The gate electrode layer may include a metal having low electrical resistance, e.g., tungsten, titanium, tantalum, and platinum, and the barrier layer may include a metal nitride, e.g., tungsten nitride, titanium nitride, tantalum nitride.

Thereafter, the gate electrode layer may be partially removed. Thus, gate electrodes 170 may be formed in the second gaps 340. In example embodiments, the gate electrode layer formed in the trench 148 may be removed. The removal process may be a wet etching process. The gate electrodes 170 may extend in the first direction.

That is, the gate electrodes 170 of the ground selection transistor, the cell transistor, and the cell selection transistor may include a metal. On the other hand, the supporting layer 108 serving as the gate electrode of the GIDL transistor may include polysilicon.

Figure 22:
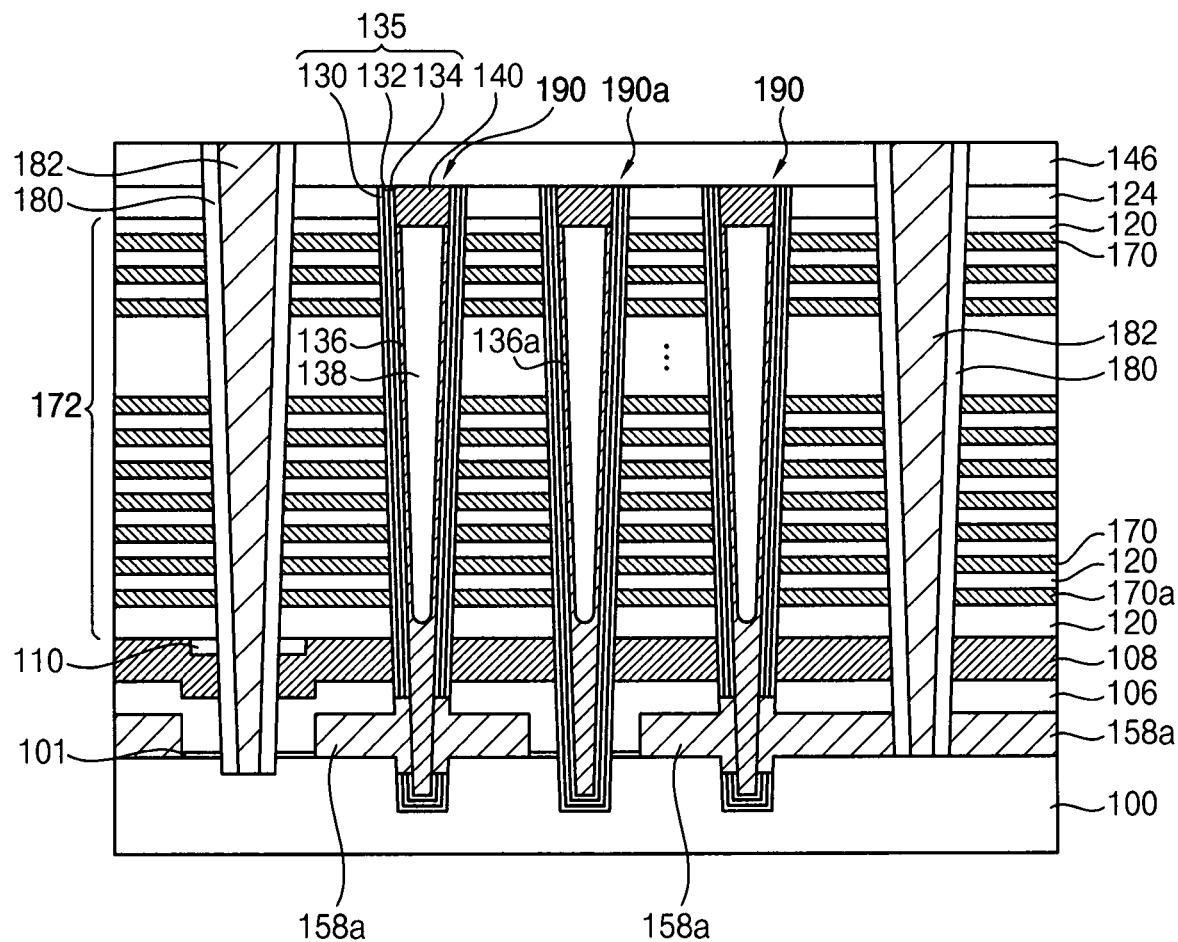

Referring to FIG. 22, a spacer layer may be formed on the sidewall of the trench 148, and the spacer layer may be anisotropically etched to expose the substrate 100 in the bottom of the trench 148. Thus, a spacer 180 may be formed on the sidewall of the trench 148. The spacers 180 may include, e.g., silicon oxide.

Thereafter, a conductive layer may be formed on the second insulating interlayer 146 to fill the trench 148. The conductive layer may be planarized until an upper surface of the second insulating interlayer 146 may be exposed to form a common source line 182. The common source line 182 may include, e.g., a barrier metal layer and a metal pattern. The barrier metal layer may include a metal nitride, e.g., tungsten nitride, titanium nitride, tantalum nitride, etc. Also, the metal pattern may include a metal having a low electrical resistance, e.g., tungsten, titanium, tantalum, platinum, etc.

Although not shown, an upper insulating interlayer may be formed on the second insulating interlayer 146, the common source line 182 and the spacers 180. Then, wirings may be formed be electrically connected to each of the capping pattern 140, the common source line 182, and the gate electrode 170.

Figure 23:
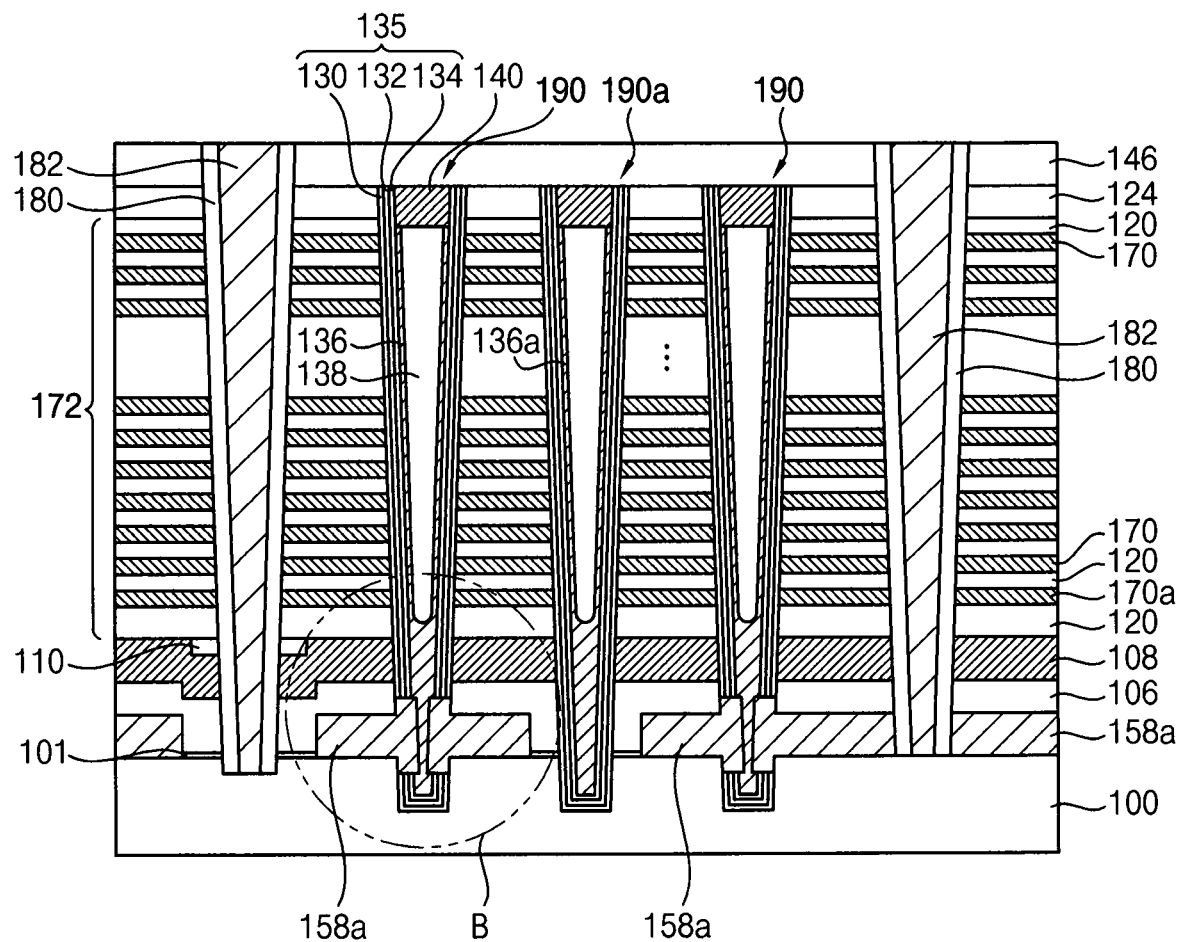
Figure 24:
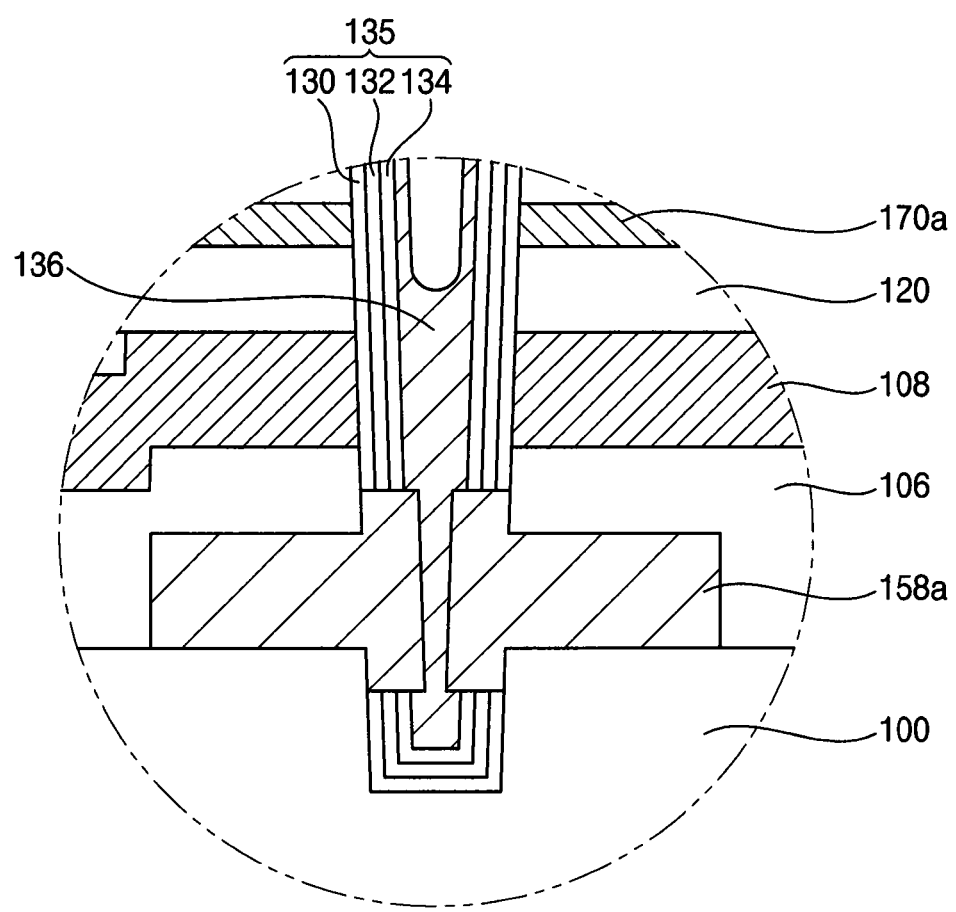

FIGS. 23 and 24 are cross-sectional views illustrating a vertical semiconductor device in accordance with example embodiments.

FIG. 24 is an enlarged view of a portion "B" in FIG. 23.

The vertical semiconductor device shown in FIGS. 23 and 24 may be substantially the same as the vertical semiconductor device illustrated with reference to FIG. 1, except for shapes of the channel connection pattern and the channel. Therefore, a detailed description of the same elements may be omitted.

Referring to FIGS. 23 and 24, a lower portion of the channel 136 may contact the channel connection pattern 158a so that the channel 136 may be electrically connected to the substrate 100.

A contact portion between the channel 136 and the channel connection pattern 158a may be disposed at a level below the bottom of the supporting layer 108. That is, the contact portion may correspond to the lower portion of the channel 136.

A portion of the charge storage structure 135 formed at the contact portion between the channel 136 and the channel connection pattern 158a may be removed.

In example embodiments, a width of the channel 136 at the contact portion between the channel 136 and the channel connection pattern 158a may be less than a width of the channel 136 at a portion above and below the channel connection pattern 158a. That is, the sidewall of the channel 136 may be bent or recessed at a channel portion contacting the channel connection pattern 158a.

Figure 25:
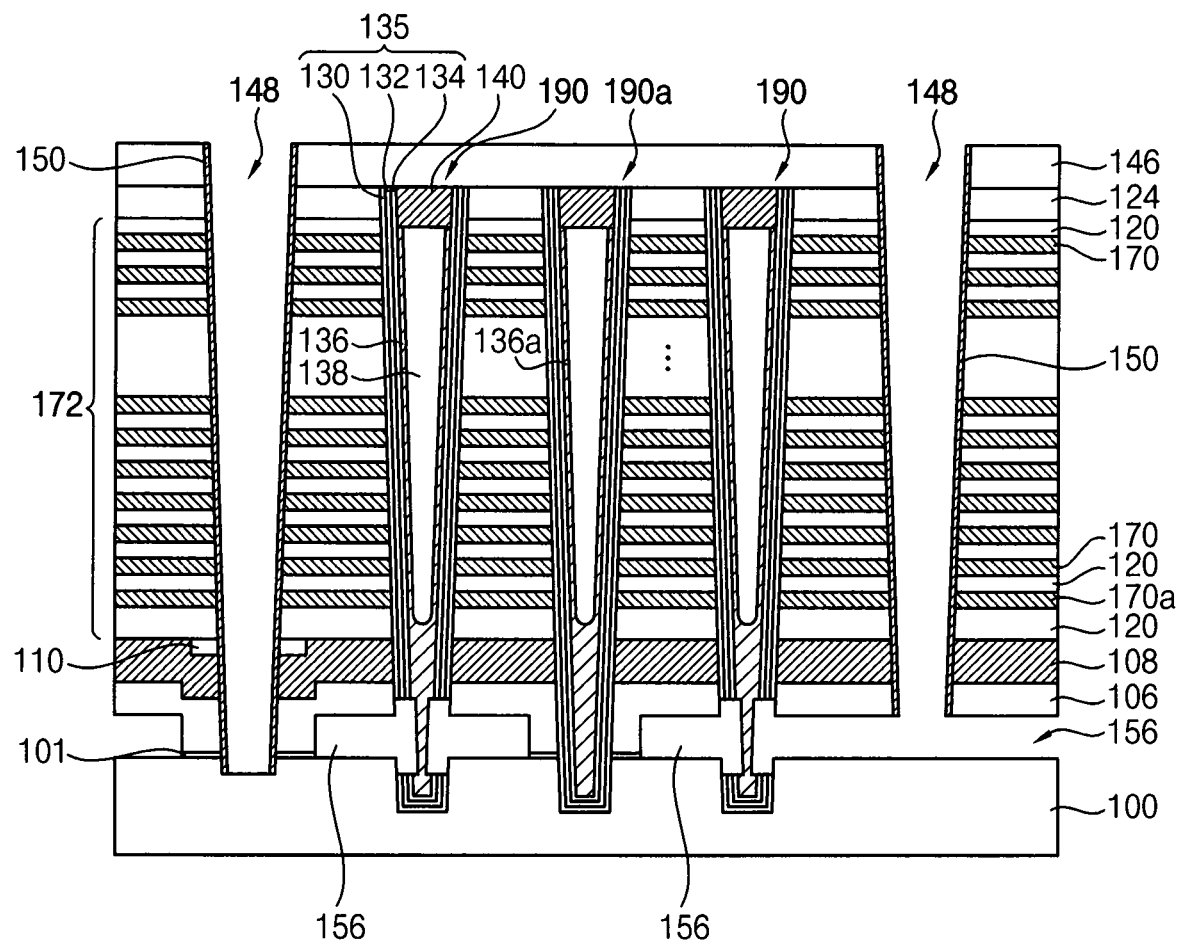

FIG. 25 is a cross-sectional view illustrating stages of a method of manufacturing a vertical semiconductor device in accordance with example embodiments.

The method of manufacturing the vertical semiconductor device may include processes substantially the same as or similar to those illustrated with reference to FIGS. 6 to 22. Thus, detailed description of the method may be omitted.

First, processes as illustrated with reference to FIGS. 6 to 17 may be performed. Then, referring to FIG. 25, an exposed sidewall of the channel 136 may be further etched. Thus, the width of the channel 136 at an etched portion may be relatively reduced. The etching process may include a wet etching process.

The exposed sidewall of the channel 136 may be further etched so that a surface damage included in the channel 136 may be removed by the etching process.

Thereafter, processes as illustrated with reference to FIGS. 18 to 22 may be performed. Thus, the semiconductor device shown in FIGS. 23 and 24 may be manufactured.

Figure 26:
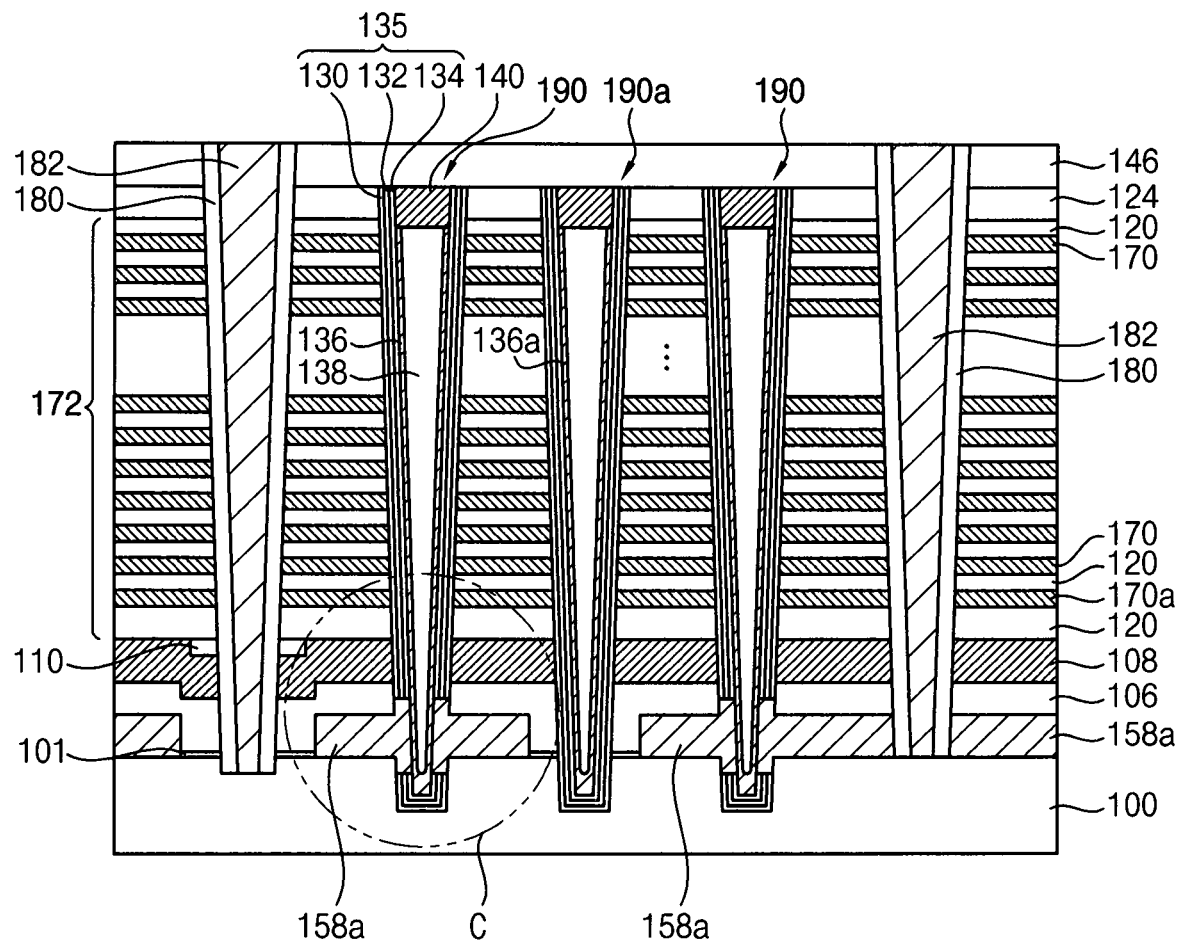
Figure 27:
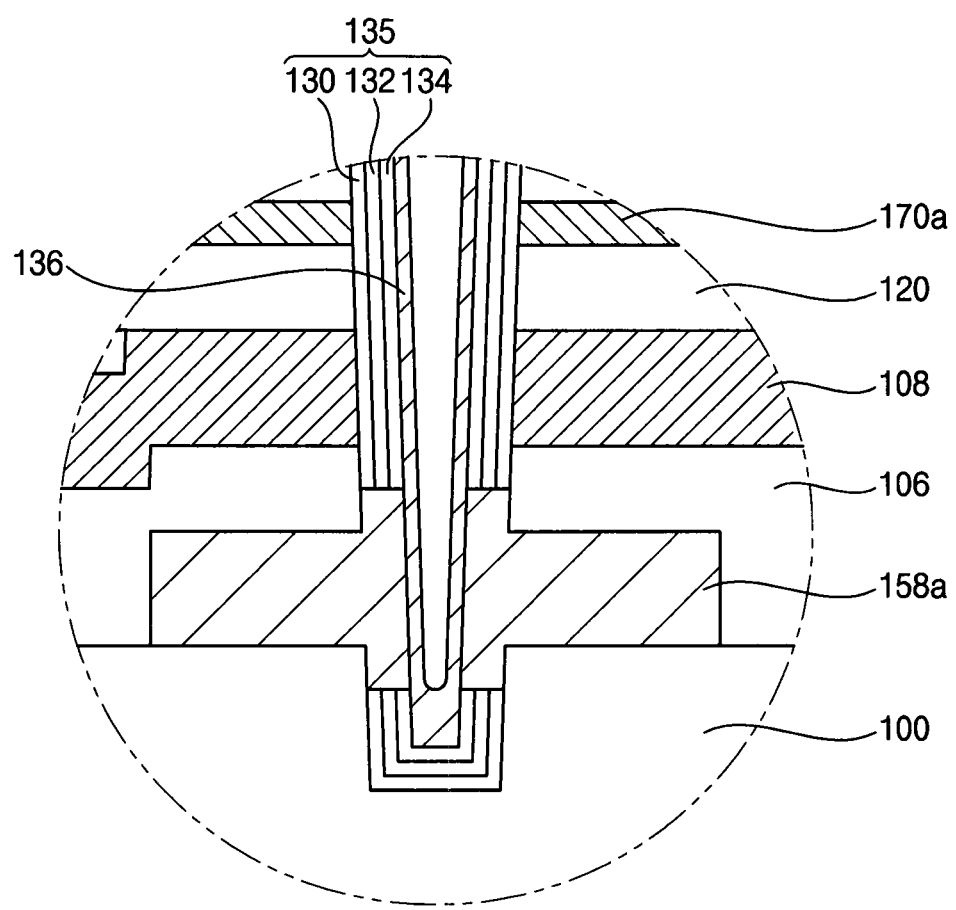

FIGS. 26 and 27 are cross-sectional views illustrating a vertical semiconductor device in accordance with example embodiments.

FIG. 27 is an enlarged view of a portion "C" in FIG. 26.

The vertical semiconductor device shown in FIGS. 26 and 27 may be the same as the vertical semiconductor device illustrated with reference to FIG. 1, except for a shape of the channel. Therefore, a detailed description of the same elements may be omitted.

Referring to FIGS. 26 and 27, the channel 136 may have a tapering cylindrical shape.

In example embodiments, a bottom and a sidewall of the channel 136 may have substantially the same thickness. That is, a polysilicon layer corresponding to a lower portion of the channel 136 may not be folded. Therefore, the bottom of an inner space of the channel 136 may be disposed at a level below an upper surface of the supporting layer 108.

The method of manufacturing the vertical semiconductor device may include processes substantially the same as or similar to those illustrated with reference to FIGS. 6 to 22. However, when the process illustrated with reference to FIG. 11 is performed, the channel layer may be formed on the tunnel insulation layer in the channel hole 126a and the dummy channel hole 126b to have a uniform thickness. The channel layer may not be folded in a lower portion of each of the channel hole 126a and the dummy channel hole 126b, so that the channel layer may not fill the lower portion of the channel hole 126a and the dummy channel hole 126b.

Figure 28:
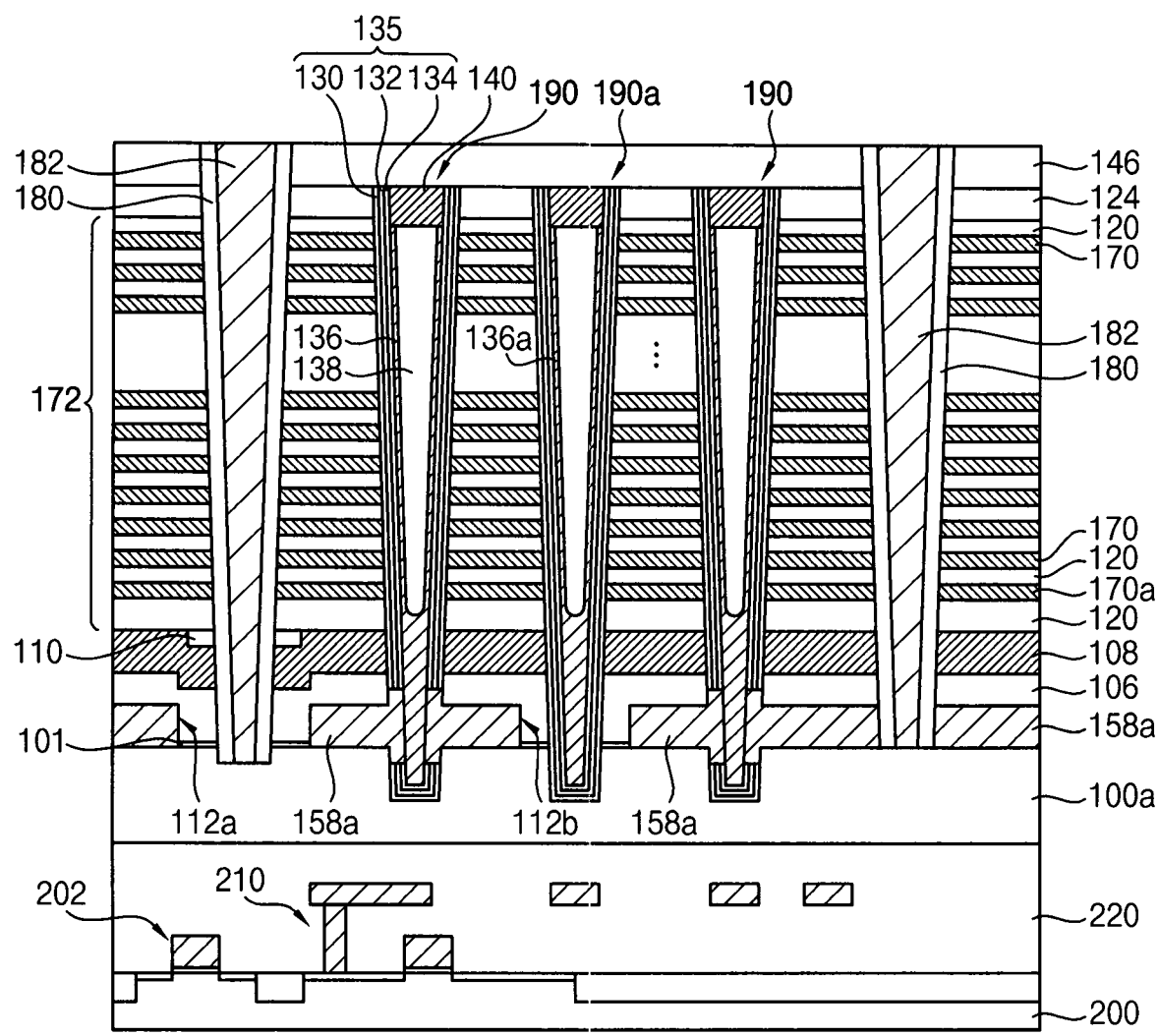

FIG. 28 is a cross-sectional view illustrating a vertical semiconductor device in accordance with example embodiments.

The vertical semiconductor device may have a cell on peri (COP) structure in which peripheral circuits are formed below memory cells.

Referring to FIG. 28, circuit patterns serving as the peripheral circuits may be formed on a lower substrate 200. A lower insulating interlayer 220 may be formed to cover the circuit patterns. Also, a lower wiring 210 electrically connected to the circuit patterns may be formed.

The lower substrate 200 may include a field region on which an isolation pattern is formed, and an active region on which no isolation pattern is formed.

The circuit patterns may include transistors 202, resistors, capacitors, etc. The transistor 202 may include a gate, a source and a drain.

The lower wiring 210 may be formed in the lower insulating interlayer 220. An uppermost surface of the lower insulating interlayer 220 may be flat.

A base layer 100a may be formed on the lower insulating interlayer 220. The base layer 100a may include, e.g., polysilicon. In example embodiments, the base layer 100a may serve as an upper substrate.

Structures shown in FIGS. 1 to 3 may be formed on the base layer 100a.

In some example embodiments, one of the structures shown in FIGS. 4, 5, 23, and 26 may be formed on the base layer 100a.

The vertical semiconductor device may have a COP structure, so that a horizontal area of a substrate for forming the peripheral circuit may not be required. Thus, a highly integrated vertical semiconductor device may be manufactured.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims.

What is claimed is:

1. A vertical semiconductor device, comprising:
a plurality of channel connection patterns contacting an upper surface of a substrate;
a lower insulation layer formed on the channel connection patterns and in a space between the channel connection patterns;
a supporting layer formed on the lower insulation layer to be spaced apart from the channel connection patterns, the supporting layer comprising polysilicon doped with impurities;
a stacked structure formed on the supporting layer, the stacked structure in which insulation layers and gate electrodes are stacked; and
a channel structure passing through the stacked structure, the supporting layer and the lower insulation layer, and extending to an upper portion of the substrate, the channel structure comprising a charge storage structure and a channel,
wherein the channel contacts the channel connection pattern, and
wherein the charge storage structure and the channel are disposed to face the gate electrodes and the supporting layer, and the supporting layer is configured to function a gate of a gate induced drain leakage (GIDL) transistor.

2. The vertical semiconductor device of claim 1, wherein the gate electrodes formed above the supporting layer comprises a metal, and
wherein the supporting layer is an only layer serving as the gate of the GIDL transistor in the vertical semiconductor device.

3. The vertical semiconductor device of claim 1, wherein the channel connection pattern comprises polysilicon doped with impurities.

4. The vertical semiconductor device of claim 1, wherein the channel structure is formed in a channel hole passing through the stacked structure, the supporting layer and the lower insulation layer, and extending to the upper portion of the substrate,
wherein the charge storage structure is formed on an upper portion of a sidewall of the channel hole disposed at a level higher than the channel connection pattern, and
wherein the channel contacts the charge storage structure and the channel connection pattern, and has a cylindrical shape.

5. The vertical semiconductor device of claim 4, wherein a bottom of an inner space of the channel having the cylindrical shape is positioned at a level between an upper surface of the supporting layer and a bottom of a lowermost gate electrode among the gate electrodes.

6. The vertical semiconductor device of claim 1, wherein the channel at a level below a lowermost gate electrode among the gate electrodes is doped with impurities, and
wherein the channel at a level at or above the lowermost gate electrode is not or less doped with the impurities compared to the channel at the level below the lowermost gate electrode.

7. The vertical semiconductor device of claim 1, further comprising:
a common source line passing through the stacked structure, the supporting layer and the lower insulation layer, and contacting a portion of the substrate; and
a spacer comprising an insulation material, the spacer surrounding a sidewall of the common source line.

8. The vertical semiconductor device of claim 7, wherein the supporting layer contacts the spacer on the sidewall of the common source line, and
wherein the supporting layer and the common source line are electrically isolated from each other by the spacer.

9. The vertical semiconductor device of claim 7, wherein an upper surface of the supporting layer comprises a recess, and the common source line passing through the recess.

10. The vertical semiconductor device of claim 1, further comprising a dummy channel structure passing through the stacked structure and the supporting layer, and extending to an upper portion of the substrate,
wherein the dummy channel structure comprises a charge storage structure and a channel that is not electrically connected to the channel connection pattern.

11. A vertical semiconductor device, comprising:
a plurality of channel connection patterns contacting an upper surface of a substrate;
a lower insulation layer formed on the channel connection patterns and a space between the channel connection patterns;
a supporting layer formed on the lower insulation layer to be spaced apart from the channel connection patterns, the supporting layer comprising polysilicon doped with impurities;
a stacked structure formed on the supporting layer, the stacked structure in which insulation layers and gate electrodes are stacked; and
a channel structure passing through the stacked structure, the supporting layer and the lower insulation layer, and extending to an upper portion of the substrate, the channel structure comprising a charge storage structure and a channel, the channel contacting the channel connection pattern and having a cylindrical shape,
wherein the charge storage structure and the channel are disposed to face the gate electrodes and the supporting layer, and
wherein a width of the channel at a level below an upper surface of the supporting layer is greater than a width of the channel at a level above the upper surface of the supporting layer.

12. The vertical semiconductor device of claim 11, wherein the gate electrodes formed above the supporting layer comprises a metal, and
wherein the supporting layer is configured to function as a gate induced drain leakage (GIDL) transistor.

13. The vertical semiconductor device of claim 11, wherein a bottom of an inner space of the channel having the cylindrical shape is positioned at a level between an upper surface of the supporting layer and a bottom of a lowermost gate electrode.

14. The vertical semiconductor device of claim 11, wherein the channel at a level below a lowermost gate electrode among the gate electrodes is doped with impurities.

15. A vertical semiconductor device, comprising:
a lower gate layer formed above a substrate, the lower gate layer being spaced apart from the substrate, and the lower gate layer comprising polysilicon doped with impurities;
a stacked structure formed on the lower gate layer, the stacked structure in which insulation layers and gate electrodes are stacked to form a memory cell string, and the gate electrodes comprising a metal; and
a channel structure passing through the stacked structure and the lower gate layer and extending to an upper portion of the substrate, the channel structure comprising a charge storage structure and a channel having a cylindrical shape,
wherein the charge storage structure and the channel are disposed to face the gate electrodes and the lower gate layer, and
wherein a width of the channel at a level below an upper surface of the lower gate layer is greater than a width of the channel at a level above the upper surface of the lower gate layer.

16. The vertical semiconductor device of claim 15, the channel at a level below a lowermost gate electrode among the gate electrodes is selectively doped with impurities.

17. The vertical semiconductor device of claim 15, further comprising:
a channel connection patterns formed on the substrate, the channel connection patterns contacting an upper surface of the substrate and the channel, the channel connection patterns being spaced apart from the lower gate layer; and
a lower insulation layer formed between the channel connection patterns and the lower gate layer.

18. The vertical semiconductor device of claim 15, wherein the lower gate layer is configured to structurally support the stacked structure, and comprises a material having an etch selectively with respect to silicon oxide and silicon nitride.

19. The vertical semiconductor device of claim 15, wherein the lower gate layer is configured to function as a gate induced drain leakage (GIDL) transistor, and
wherein a thickness of the lower gate layer in a vertical direction may be substantially equal to a channel length of the GIDL transistor.

20. The vertical semiconductor device of claim 19, the memory cell string comprise a ground selection transistor, a cell transistor and a cell selection transistor.

* * * * *